US012658898B2

(12) United States Patent
Männchen et al.

(10) Patent No.: US 12,658,898 B2
(45) Date of Patent: Jun. 16, 2026

(54) CIRCUIT AND METHOD FOR COMPENSATING NON-LINEARITIES

(71) Applicant: Fraunhofer-Gesellschaft zur Förderung der angewandten Forschung e.V., Munich (DE)

(72) Inventors: Andreas Männchen, Ilmenau (DE); Tobias Fritsch, Ilmenau (DE); Matthias Fiedler, Ilmenau (DE)

(73) Assignee: Fraunhofer-Gesellschaft zur Förderung der angewandten Forschung e.V., Munich (DE)

( * ) Notice: Subject to any disclaimer, the term of this patent is extended or adjusted under 35 U.S.C. 154(b) by 270 days.

(21) Appl. No.: 18/424,056

(22) Filed: Jan. 26, 2024

(65) Prior Publication Data

US 2024/0195395 A1    Jun. 13, 2024

Related U.S. Application Data

(63) Continuation of application No. PCT/EP2022/058734, filed on Mar. 31, 2022.

(30) Foreign Application Priority Data

Jul. 30, 2021    (DE) ..................... 10 2021 208 318.8

(51) Int. Cl.
*H03K 5/1252*    (2006.01)

(52) U.S. Cl.
CPC .................................. *H03K 5/1252* (2013.01)

(58) Field of Classification Search
CPC ..................................................... H03K 5/1252

(Continued)

(56) References Cited

U.S. PATENT DOCUMENTS

| | | | |
|---|---|---|---|
| 4,618,808 A | 10/1986 | Ish-Shalom et al. | |
| 6,597,650 B2 | 7/2003 | Katakura et al. | |

(Continued)

FOREIGN PATENT DOCUMENTS

| | | |
|---|---|---|
| CN | 110677132 A | 1/2020 |
| DE | 382177 C | 9/1923 |

(Continued)

OTHER PUBLICATIONS

Kenji Tokuda, "Notice of Reasons for Rejection for JP Application No. 2024-505414", Jan. 21, 2025, LQ07254A1, JPO, Japan.

(Continued)

*Primary Examiner* — Dominic D Saltarelli
(74) *Attorney, Agent, or Firm* — Bridgeway IP Law Group, PLLC; Jihun Kim

(57)    ABSTRACT

Described are a circuit for compensating non-linearities essentially without changing a characteristic curve operating point and/or operating range, having: an alternating voltage signal source for providing an input signal; a control unit which receives the input signal and converts it to a predistorted signal depending on at least one preset predistortion parameter; and a sink for receiving the predistorted signal, the sink being coupled to an adjusting unit configured to provide the sink with an adjusting signal, to operate the sink in an operating range or at an operating point, the control unit being configured to receive at least one sensor signal of the sink in a feedback manner and to adapt the at least one preset predistortion parameter based on the at least one sensor signal, and a corresponding method.

36 Claims, 13 Drawing Sheets

(58) Field of Classification Search
USPC ......................................................... 375/296
See application file for complete search history.

(56)                    References Cited

U.S. PATENT DOCUMENTS

| | | | |
|---|---|---|---|
| 11,671,123 B1 * | 6/2023 | McCormick ............ | H03F 3/245 |
| | | | 375/262 |
| 2005/0110562 A1 | 5/2005 | Robinson et al. | |
| 2005/0210354 A1 | 9/2005 | Kurokami | |
| 2007/0008033 A1 | 1/2007 | Okazaki | |
| 2009/0146740 A1 | 6/2009 | Lau et al. | |
| 2009/0227215 A1 | 9/2009 | Mccallister | |
| 2017/0047900 A1 | 2/2017 | Lokas | |
| 2017/0214370 A1 | 7/2017 | Tseng et al. | |

FOREIGN PATENT DOCUMENTS

| | | |
|---|---|---|
| DE | 3307309 C2 | 7/1989 |
| JP | 2003-283586 A | 10/2003 |
| JP | 2007-019782 A | 1/2007 |

OTHER PUBLICATIONS

David Tumpod et al., "Linearizing an electrostatically driven MEMS speaker by applying pre-distortion", Sensors and Actuators A: Physical, 2015, 236th edition, pp. 289-298.
Steven Ian Moore et al., "Feedback-Controlled MEMS Force Sensor for Characterization of Microcantilevers", Journal of Microelectromechanical Systems, 2015, 24th edition, No. 4, pp. 1092-1101.
Simona Mosca, "Improving the virgo detector sensitivity: Effect of high power input beam and Electrostatic actuators for mirror control", doctoral thesis, Università degli Studi di Napoli Federico II, 2009, on p. 78.
Steve Temme et al., "Total Harmonic Distortion oder Total Noncoherent Distortion (A new method for measuring distortion using a multitone stimulus and noncoherence", Journal of the Audio engineering Society, 2008, 56. Jg., Nr. 3, S. 176-188.

* cited by examiner

THD prediction and reduction

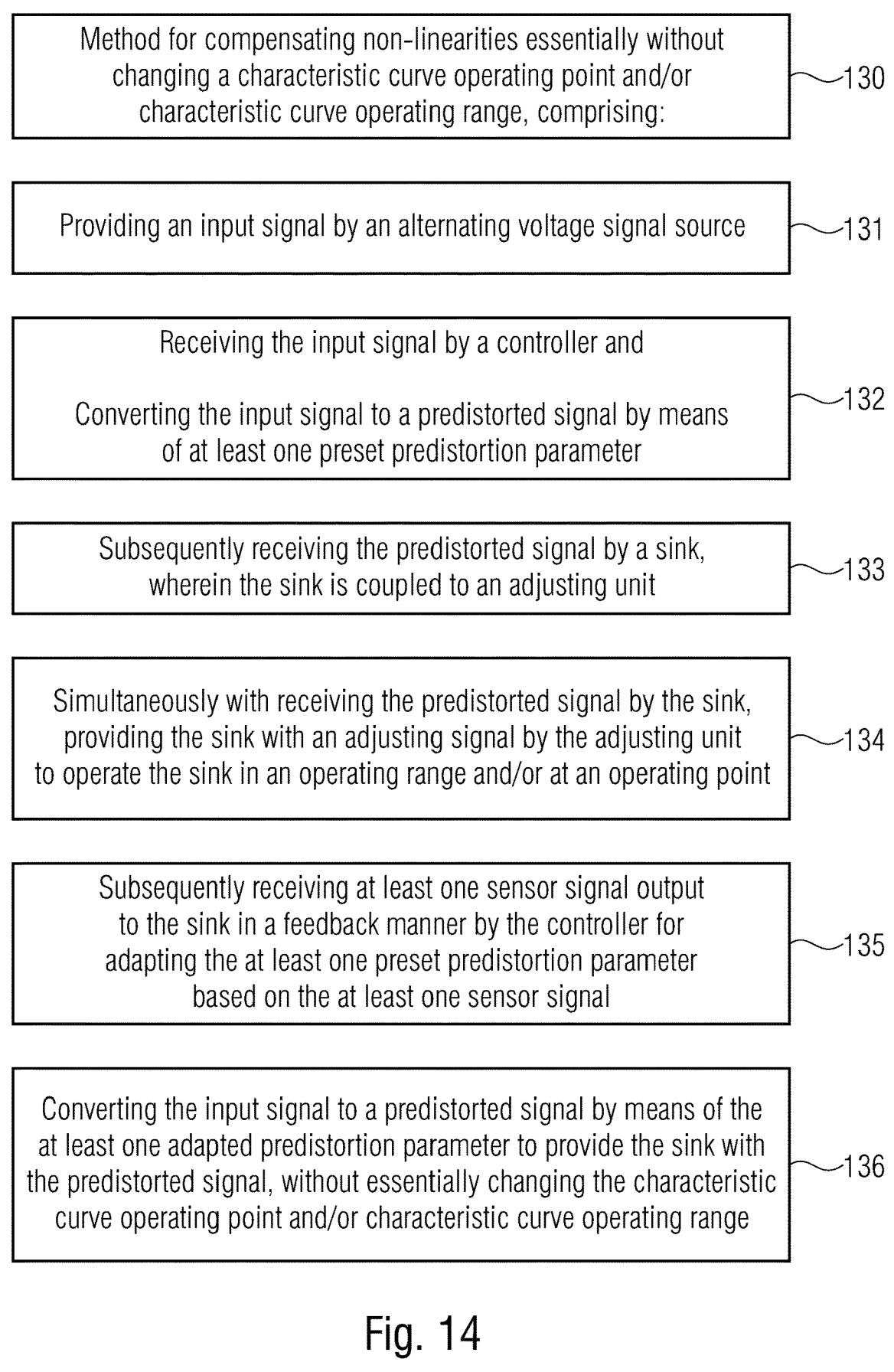

Method for compensating non-linearities essentially without changing a characteristic curve operating point and/or characteristic curve operating range, comprising:　～130

Providing an input signal by an alternating voltage signal source　～131

Receiving the input signal by a controller and

Converting the input signal to a predistorted signal by means of at least one preset predistortion parameter　～132

Subsequently receiving the predistorted signal by a sink, wherein the sink is coupled to an adjusting unit　～133

Simultaneously with receiving the predistorted signal by the sink, providing the sink with an adjusting signal by the adjusting unit to operate the sink in an operating range and/or at an operating point　～134

Subsequently receiving at least one sensor signal output to the sink in a feedback manner by the controller for adapting the at least one preset predistortion parameter based on the at least one sensor signal　～135

Converting the input signal to a predistorted signal by means of the at least one adapted predistortion parameter to provide the sink with the predistorted signal, without essentially changing the characteristic curve operating point and/or characteristic curve operating range　～136

Fig. 14

CIRCUIT AND METHOD FOR COMPENSATING NON-LINEARITIES

CROSS-REFERENCE TO RELATED APPLICATIONS

This application is a continuation of copending International Application No. PCT/EP2022/058734, filed Mar. 31, 2022, which is incorporated herein by reference in its entirety, and additionally claims priority from German Application No. 10 2021 208 318.8, filed Jul. 30, 2021, which is also incorporated herein by reference in its entirety.

TECHNICAL FIELD

The present invention relates to a circuit for compensating non-linearities essentially without changing a characteristic curve operating point and/or characteristic curve operating range, and to a method for compensating non-linearities essentially without changing a characteristic curve operating point and/or characteristic curve operating range.

BACKGROUND OF THE INVENTION

During operation, non-linearities of a system result in undesired deviations of the system behavior from a purely linear relation between input signal and system response. These non-linearities can be compensated after identifying the same, for example as characteristic curves, using inverse functions, among other things. However, this becomes particularly problematic if the system is operated at a certain operating point (for example using a DC bias) and/or operating range (for example using minimum or maximum input voltage amplitude), which are intended not to change. Using inverse functions for compensating non-linearities of a system may additionally result in an undesired change in the system output level.

In the publication by TUMPOLD, David et al. Linearizing an electrostatically driven MEMS speaker by applying predistortion. *Sensors and Actuators A: Physical,* 2015, 236$^{th}$ edition, pages 289-298, a predistortion function for an electrostatic MEMS loudspeaker has been found using a Local Model Network and Direct Inverse Control. The method described in TUMPOLD is more complicated than the novel method described here, both as regards implementation and collecting the data required. The operating point and operating range of the MEMS loudspeaker are not automatically maintained by this predistortion function.

In the publication by MOORE, Steven Ian et al. Feedback-Controlled MEMS Force Sensor for Characterization of Microcantilevers. *Journal of Microelectromechanical Systems,* 2015, 24$^{th}$ edition, No. 4, pages 1092-1101, the predistortion for an electrostatic sensor is implemented as an analog circuit by means of a square root function. The operating range and operating point are not considered particularly and are not automatically maintained by this predistortion function. Only square distortions can be compensated.

In the publication by MOSCA, Simona. Improving the virgo detector sensitivity: Effect of high power input beam and Electrostatic actuators for mirror control, doctoral thesis, Università degli Studi di Napoli Federico II, 2009, on page 78, a way of predistorting the control signal for an electrostatic actuator is explained. Here, a square root function is amplitude-modulated so that with a correspondingly high modulation frequency approximately only a DC portion and a linear component remain. The operating point and operating range of the actuator are not automatically maintained by this predistortion function, but may have to be entered manually. Only square distortions can be compensated.

DE382177C describes deriving inverse functions for reducing harmonics or generating desired harmonics in high-frequency technology. The inverse function is, for example, derived directly from the system characteristic curve by means of geometrical construction, which either has to be known or is derived from the relation between input and output amplitudes. Maintaining the operating point and operating range of the system does not take place automatically.

DE3307309C2 describes a method for transmitting electrical signals, wherein the signals to be transmitted are predistorted before being supplied to a transmission element, wherein the operating point and the operating range are not considered at all in the procedure. Maintaining the operating point and operating range of the system does not take place automatically. The system described in DE3307309C2 deviates considerably from the invention explained here: There are, for example, special requirements to the input signal like the lack of certain frequency components, in addition predistortion is performed by means of a polynomial.

U.S. Pat. No. 4,618,808A discloses compensation for square distortions using a square root function. The operating range and operating point are not considered particularly and are not maintained automatically by this predistortion function.

U.S. Pat. No. 6,597,650B2 discloses a parametrized hyperbolical function for compensating particularly square distortions in a transmission system/data carrier reading system. The operating range of the system is maintained only approximately.

By means of DC correction, the equalized signal is freed from the mean value in some implementations. The measure of non-linear distortions relates only to square distortions of pure or sinusoidal tones.

An object underlying the present invention is providing a circuit and a method using which an operating point and/or operating range are maintained automatically and at the same time non-linear predistortions at an output of the circuit can be reduced by means of predistorting the signal.

SUMMARY

According to an embodiment, a circuit for compensating non-linearities essentially without changing a characteristic curve operating point and/or characteristic curve operating range, may have: an alternating voltage signal source for providing an input signal; a control unit which receives the input signal and converts the input signal to a predistorted signal depending on at least one preset predistortion parameter; and a sink for receiving the predistorted signal, the sink being coupled to an adjusting unit configured to provide the sink with an adjusting signal, to operate the sink in an operating range or at an operating point, wherein the control unit is configured to receive at least one sensor signal of the sink in a feedback manner and to adapt the at least one preset predistortion parameter based on the at least one sensor signal, wherein the control unit converts the input signal to a predistorted signal by means of the at least one adapted predistortion parameter to provide the sink with the predistorted signal, without essentially changing the characteristic curve operating point and/or characteristic point operating range.

According to another embodiment, a method for compensating non-linearities essentially without changing a characteristic curve operating point and/or characteristic curve operating range, may have the steps of: providing an input signal by an alternating voltage signal source; receiving the input signal by a control unit and converting the input signal to a predistorted signal by means of at least one preset predistortion parameter; subsequently receiving the predistorted signal by a sink, the sink being coupled to an adjusting unit; simultaneously to receiving the predistorted signal by the sink, providing the sink with an adjusting signal by the adjusting unit to operate the sink in an operating range and/or at an operating point; subsequently receiving at least one sensor signal output at the sink in a feedback manner by the control unit for adapting the at least one preset predistortion parameter based on the at least one sensor signal; converting the input signal to a predistorted signal by means of the at least one adapted predistortion parameter to provide the sink with the predistorted signal, without essentially changing the characteristic curve operating point and/or characteristic curve operating range.

Another embodiment may have a non-transitory digital storage medium having stored thereon a computer program for performing a method for compensating non-linearities essentially without changing a characteristic curve operating point and/or characteristic curve operating range, the method having the steps of: providing an input signal by an alternating voltage signal source; receiving the input signal by a control unit and converting the input signal to a predistorted signal by means of at least one preset predistortion parameter; subsequently receiving the predistorted signal by a sink, the sink being coupled to an adjusting unit; simultaneously to receiving the predistorted signal by the sink, providing the sink with an adjusting signal by the adjusting unit to operate the sink in an operating range and/or at an operating point; subsequently receiving at least one sensor signal output at the sink in a feedback manner by the control unit for adapting the at least one preset predistortion parameter based on the at least one sensor signal; converting the input signal to a predistorted signal by means of the at least one adapted predistortion parameter to provide the sink with the predistorted signal, without essentially changing the characteristic curve operating point and/or characteristic curve operating range, when the computer program is run by a computer coupled to a circuit.

The core idea underlying the present invention is providing a circuit which, in particular during operation, is able to perform a method in which non-linear predistortions of a signal, with which a sink is provided, can be reduced by means of a predistortion established in particular during operation of the circuit and, at the same time, an operating point and/or an operating range are maintained automatically. In other words, using the suggested method and/or the suggested circuit, a signal which is non-linear relative to the original input signal can be transferred to a sink. The signal transferred finally to the sink is predistorted such that the signal at the output of the sink, referred to here as sensor signal, is as linear as possible relative to the original input signal. Additionally, the sink can be operated at a constant operating point and/or operating range. The predistortion is performed such that the operating point does not change, i.e. there is no DC contribution by the predistortion, and the operating range is maintained, i.e. an original AC input voltage range is not exceeded and only dropped below as little as possible. In particular, no special input signal, in particular no input signal deviating from conventional input signals, is required, and no system identification has to be performed before being put into operation. Rather, conventional signals can be used.

The term "as linear as possible" is to be understood as follows:

At first, there is the input signal. The input signal is linear, in particular identical, relative to itself. The predistortion performs various linear and non-linear transformations, resulting in the predistorted signal to be more or less strongly non-linear relative to the input signal. The predistorted signal is finally transferred to the sink which in turn is a non-linear system. At an output of the sink, which is monitored by means of sensor technology, one or more sensor signals are generated, which are non-linear relative to the predistorted signal. If the predistortion is adjusted optimally by the suggested circuit and by the suggested method, the sensor signal at the output of the sink in the best case is linear relative to the input signal. Depending on the predistortion function used and the characteristics of the sink, however, the optimum may be an only approximately linear sensor signal relative to the input signal.

The suggested circuit for compensating non-linearities essentially without changing a characteristic curve operating point and/or characteristic curve operating range comprises an alternating voltage signal source for providing an input signal; a control unit which receives the input signal and converts the input signal into a predistorted signal in dependence on at least one preset predistortion parameters; and a sink for receiving the predistorted signal, wherein the sink is coupled to an adjusting unit configured to provide the sink with an adjusting signal so as to operate the sink in an operating range or at an operating point. The control unit is configured to receive at least one sensor signal of the sink in a feedback manner and to adapt the at least one preset predistortion parameter based on the at least one sensor signal, which may also be referred to as sink output signal. The preset parameter(s) can be adjusted such that the predistortion initially hardly has an influence on the signal. Exemplarily, the predistortion can be implemented such that it is inaudible or causes an interfering movement of insignificant amplitude. The predistorted signal is passed on to the sink, which reacts to the signal, resulting in a type of system response of the sink. This system responds, i.e. a sink output signal, is then provided at the output of the sink. Feedback manner here is to be understood such that the sink output signal, which in this case is also referred to as sensor signal, or a measured value based thereon is fed back to the control unit. The sensor signal is applied again to an input of the control unit, wherein the sensor signal is applied to a different input of the control unit than the original input signal. This is a feedback path of control. In the present case, the terms control unit, control device, control means, controller etc., are used as synonyms.

The control unit in this feedback path operates as follows: The original AC input signal is predistorted by the control unit. The predistortion is adjusted using one or more parameters. These parameters comprise initial values (for example such that the predistortion initially only has a minimum effect). The predistorted signal is then passed on to the sink, which reacts to the signal, and a system responds, in the present case referred to as sensor signal, is measured. The sensor signal is fed back to a separate input of the control unit. Based on the sensor signal or a derived measured value for the non-linearity of the sensor signal, the predistortion parameters of the control unit are then adapted such that the predistortion of the original input signal will in the future result in a minimization of predistortions at the output of the sink. The signal predistorted by the new set of parameters is then again passed on to the sink etc. This describes a control loop comprising the feedback path. The control unit converts the input signal to a predistorted signal by means of the at least one adapted predistortion parameter so as to provide the sink with the predistorted signal, without essentially changing the characteristic curve operating point and/or characteristic curve operating range.

Without essentially changing the characteristic curve operating point and/or characteristic curve operating range can be understood here such that the operating point, in particular a DC offset, is maintained and the operating range changes "as little as possible", with an important boundary condition according to which the maximums of the original operating range must never be exceeded. This means that the original operating range is maintained and only a part thereof is used, wherein one of the extreme values can always be pushed to the limit. This boundary condition is blurred if the optional level compensation is used. In this case, the original operating range may be exceeded partly. Alternatively, the operating range may also be maintained when the DC portion generated by the predistortion function is adapted correspondingly, instead of being removed completely. A correspondingly selected DC portion may thus provide for the operating range of the input signal to be maintained. Thus, an additional DC portion is introduced, which then changes the operating point of the sink. In addition, there is a further alternative where neither the operating point nor the operating range is maintained unchanged. Instead, balancing the deviations of both quantities between the predistorted signal and the input signal may be performed. In this case, both the operating point and the operating range would deviate "a little" from the input signal.

The following example serves for a further explanation of the term "without essentially changing the characteristic curve operating point and/or characteristic curve operating range":

A sink $y=(1+x)^3$ is equalized such that the operating point (DC Offset=1) is maintained. Thus, from among the original operating range [−1:1] (this is, for example, the case with x=sin(2*π*f*t)), only the range [−1:0.4] is used in the end. The operating range of the predistorted signal is within the original range and pushes it to a limit up to an extreme value (−1). A top-to-top signal stroke in this example is still 70% of the original signal. This example represents a so-called negative extreme case. Usually, the operating range of the predistorted signal is closer to the that of the input signal, like [−1:0.95], for example.

Due to the control loop just described, distortions in the sensor signal can be reduced. The predistortion parameters are changed in accordance with the control loop, the predistorted signal is passed on to the sink which reacts to the signal, from which a sensor signal having a certain distortion and, thus, a certain value of a target function results. Predistortion parameters are adapted such that the distortions in the sensor signal should become smaller over time. The target function will be discussed below.

The term DC portion and the term DC offset are used as synonyms here.

The alternating voltage signal source may provide digital or analog signals here. Signal processing using the suggested circuit may take place using digital or analog signals. In particular, the alternating voltage signals here are to be understood to be discrete amplitude values at regular sampling times, which reach the control unit. However, it is also feasible for the control unit to be provided with analog signals which may be transformed to digital signals by the control unit. It is conceivable for the control unit to be able to convert the digital signal back to an analog one, before the signal is transferred to the sink. An algorithm which realizes the method described here by means of the circuit described may be implemented for analog or digital signals.

The predistorted signal here may be a signal with a DC portion, without a DC portion and/or with a known range of values, wherein the range of values comprises a maximum value and a minimum value which the predistorted signal may take.

Advantageously, the control unit is configured to, if the predistorted signal comprises a DC portion, adapt or remove the DC portion, in particular to calculate the DC portion using the predistortion parameters when removing and to subtract the calculated DC portion from the predistorted signal and/or to remove it from the predistorted signal by means of a high-pass filter with a sufficiently deep cut-off frequency. Here, a calculated DC portion would at first be subtracted from the distorted signal and then the predistorted signal from which the calculated DC portion is subtracted would be transmitted through the high-pass filter in case the "and" operation is realized. "Sufficient" here means "maintaining the bandwidth of the original signal". A high-pass filter having a sufficiently deep basic frequency is a high-pass filter which provides, after filtering, the filtered signal having a bandwidth of the original signal. In these embodiments, an operating point can be maintained. However, an embodiment is also conceivable in which the DC portion is adapted such that the operating range is maintained. Additionally, middle courses between those extremes are possible which would also entail adapting the DC portion. The predistorted signal here, which is applied directly to the sink, must not be mixed up with the DC portion which may be comprised in the predistorted signal. The DC portion of the predistorted signal is not a separate signal, but part of the predistorted signal. This DC portion will only be applied to the sink if it is not removed completely during predistortion. In particular, the DC portion is removed if the operating point is to be maintained. If, however, the operating range is to be maintained, the predistorted signal at the input of the sink comprises a correspondingly adapted DC portion.

Using the suggested circuit, non-linear distortions in the sensor signal are minimized over time. In particular, the suggested circuit here comprises a control loop so that, in particular during operation of the circuit, the non-linear distortions in the sensor signal are reduced, in particular they vanish.

A further aspect of the present invention relates to a method for compensating non-linearities essentially without changing a characteristic curve operating point and/or characteristic point operating range, the method comprising:

Providing an input signal by an alternating voltage signal source; receiving the input signal by a control unit and converting the input signal to a predistorted signal in dependence on at least one preset predistortion parameter. Subsequently, the method comprises receiving the predistorted signal by a sink, the sink being coupled to an adjusting unit. At the same time with receiving the predistorted signal by the sink, the method comprises providing the sink with an adjusting signal by the adjusting unit to operate the sink in an operating range and/or at an operating point. Subsequently, the suggested method comprises receiving at least one sensor signal output by the sink by the control unit in a feedback manner for adapting the at least one preset predistortion parameter based on the at least one sensor signal. Subsequently, converting the input signal to a predistorted signal by means of the at least one adapted predistortion parameter is performed to provide the sink with the predistorted signal, without essentially changing the characteristic curve operating point and/ or characteristic curve operating range. The distortions at the output of the sink, i.e. in the sensor signal are reduced by the suggested method. The predistorted signal is changed by a step-wise/continuous parameter adaptation such that the non-linear distortions in the sensor signal are minimized. The explanations of the terms used are also valid when using these terms in the method described. It is to be understood that the method can be executed by the suggested circuit or the circuit can be configured to realize the method.

BRIEF DESCRIPTION OF THE DRAWINGS

Embodiments of the present invention will be discussed below in greater detail referring to the appended drawings, in which:

FIG. 4 shows a more detailed signal flow chart in accordance with FIG. 2 and FIG. 3, wherein FIG. 4 is subdivided into a first part and a second part to maintain readability;

FIG. 14 shows a flow chart of a suggested method.

DETAILED DESCRIPTION OF THE INVENTION

Figure 1:
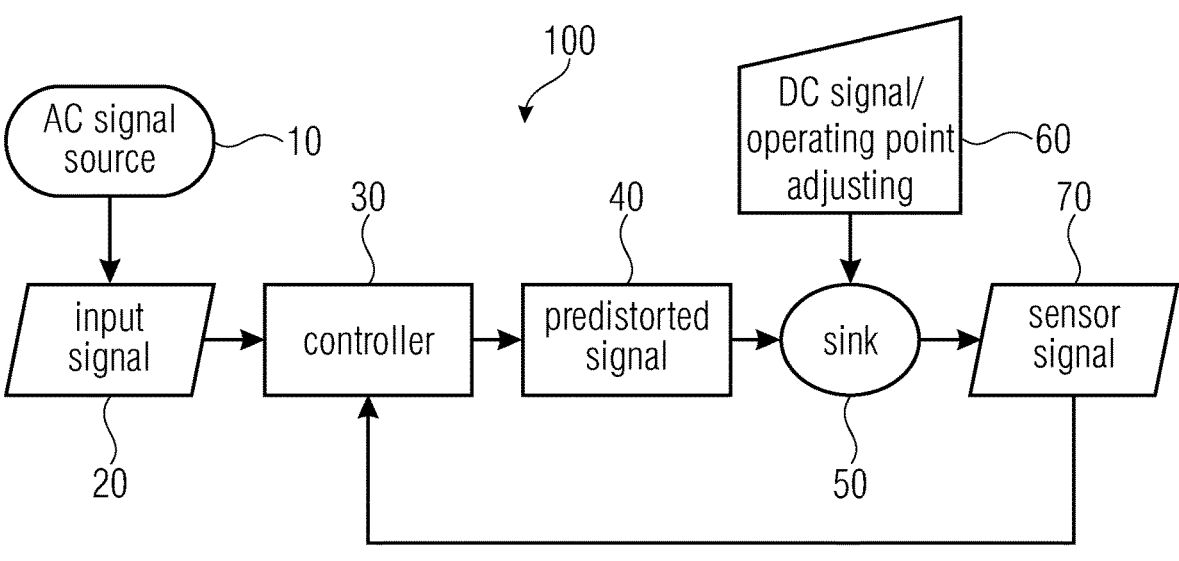
FIG. 1 shows a general signal flow chart of a suggested circuit.

Individual aspects of the invention described herein will be described below in FIGS. 1 to 14. FIGS. 1 to 14 together elucidate the principle of the present invention. In the present application, equal reference numerals relate to equal elements or elements of equal effect, wherein not all the reference numerals when being repeated are discussed again in all the drawings.

All the explanations of terms provided in this application may be applied to both the suggested circuit and the suggested method. Explanations of terms are not repeated over and over so as to avoid redundancy as far as possible.

FIG. 1 shows the components of the circuit 100 and, thus, of the general method 140. An AC signal source 10 or alternating voltage source 10 outputs an input signal x which is also referred to by the reference numeral 20. An absolute minimum value and an absolute maximum value which the input signal x may take are known. Falling below the absolute minimum value or exceeding the absolute maximum value by the input signal is not possible. This is a precondition for maintaining the operating range. The input signal 20 is predistorted by the control unit 30. The control unit 30 thus outputs a predistorted signal 40 at an output. The control unit 30 is configured to perform predistortion with the input signal 20. The predistorted signal 40 output by the control unit 30 may consequently also be understood to be an output signal of predistortion. The predistorted signal 40 may comprise only a predistorted AC signal x̂, which is passed on to a sink 50. In this case, an operating point can be maintained. When maintaining the operating point, a DC portion is removed from the predistorted signal 40 as completely as possible. It is also conceivable for the predistorted signal 40 to comprise a predistorted AC signal x̂ and a certain DC portion. In this case, the operating range would be maintained. The sink 50 comprises a fixedly defined operating point or operating point changing only slowly over time relative to the application. The operating point is, for example, determined by means of any selected DC voltage, which is provided by the adjusting unit 60. Here, the adjusting unit 60 is coupled, in particular connected, to the sink 50.

The control unit 30 uses a transmission path for an analog voltage or for a digital signal, which results in the predistorted signal and is passed on to the sink. The question as to analog or digital depends on the configuration of the control unit 30 and the sink 50 (analog I/O, digital I/O). Transmitting the signal may basically take place in different ways. Advantageously, electrical signals are dealt with, which is why the transmission path will usually be a cable. An optical transmission path or other transmission paths known to the person skilled in the art are also conceivable.

An operating point changing only slowly over time in dependence on the application means that the change of the operating point is so slow and to such an extent that the optimization of the predistortion parameters, which takes place in parallel to normal operation, can converge (at least approximately). The speed of convergence is mainly dependent on hyper-parameters of optimization, on the non-linear characteristic curve of the sink and the statistic properties of the input signal. With a changing operating point, the speed of convergence is additionally dependent on how strongly/ by which magnitude the operating point is shifted. Too strong changes which follow one another too quickly consequently prevent convergence and, thus, suitable predistortion.

Using the example of an audio application, using a specific implementation, rough values for the change rate and the intensity of the change can be derived. In order to guarantee convergence for the majority of cases, the change rate of the operating point is very high, in particular at least three orders of magnitude, below the lowest frequency of the input signal. The intensity of the change of the operating point should be the smaller, the quicker/more frequently the operating point changes, in particular, the operating point is to change by no more than the factor 3 within one minute. Well-suited examples of changes of the operating point are slow continuous material fatigue/aging or slow heating of devices.

Figure 3:
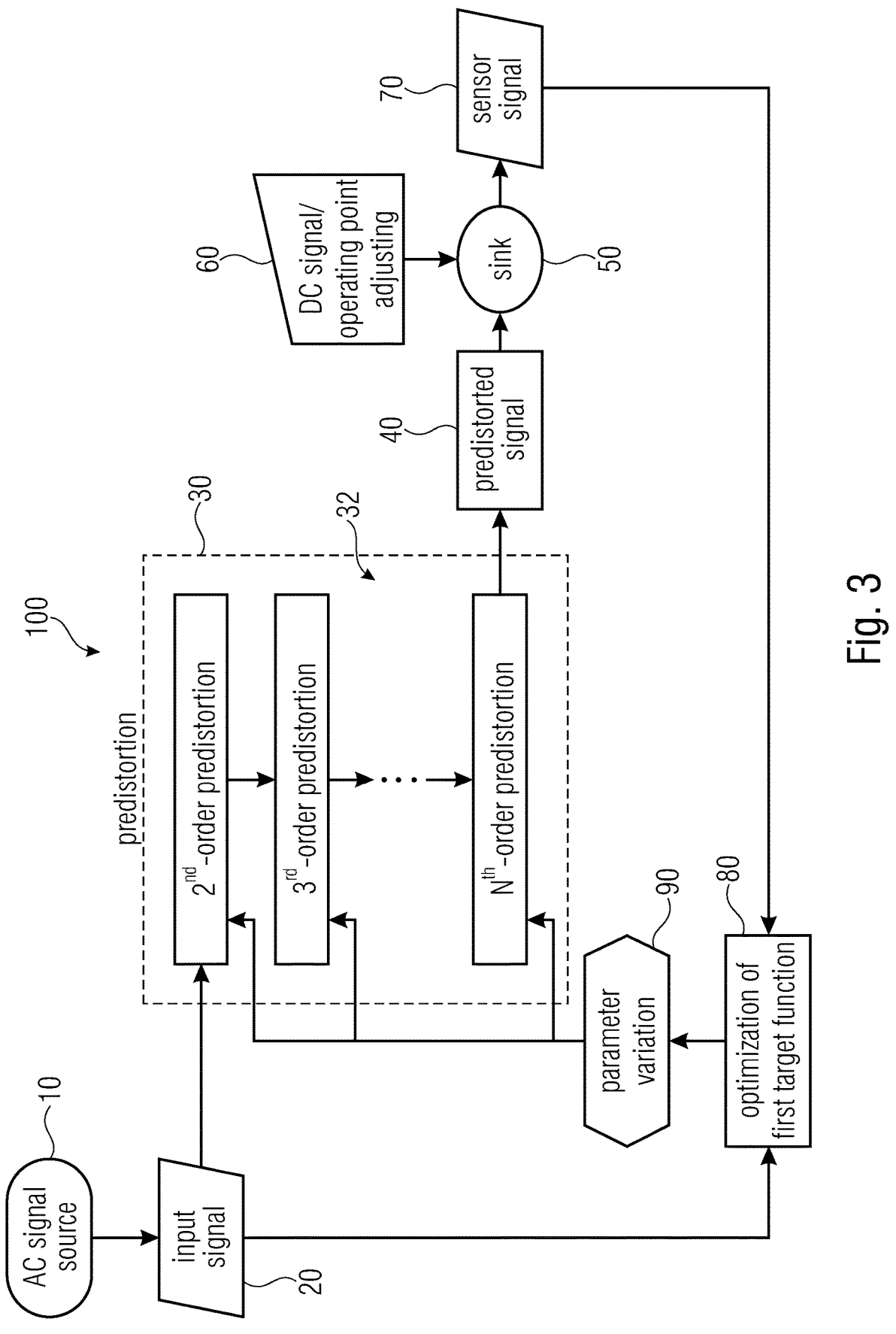
FIG. 3 shows a more detailed signal flow chart in accordance with FIG. 2.
Figure 4:
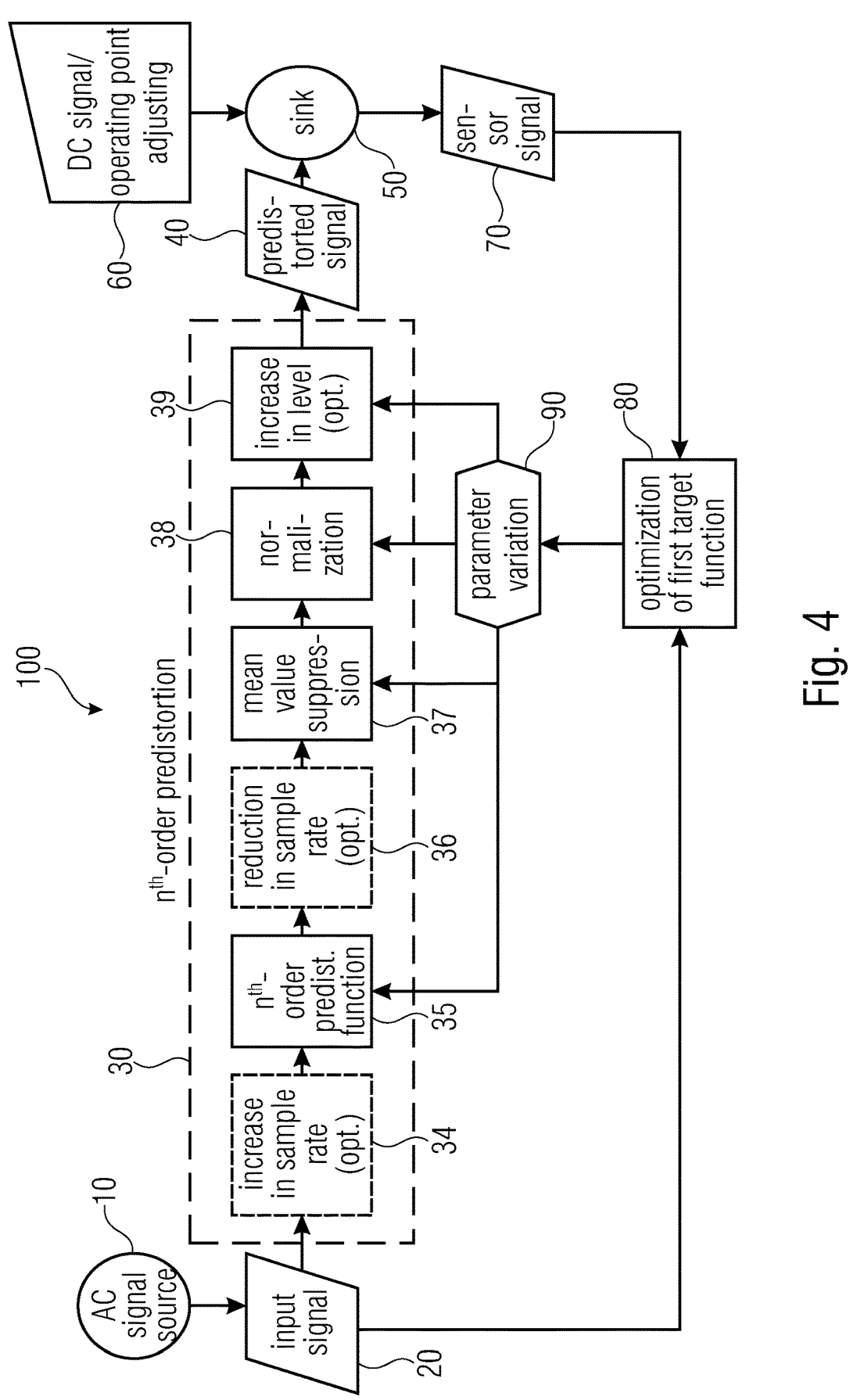

An output signal 70 or several output signals 70 of the sink are referred herein to as sensor signal(s) 70. The sensor signal 70 is fed back to the control unit 30, wherein the control unit adapts the predistortion parameters, using these data, directly (as is shown, for example, in FIGS. 3 and 4, showing a first variation) or indirectly (as is shown, for example, in FIGS. 9 and 10, showing a second variation).

The sensor signal 70 may, for example, be a measured output voltage, a current intensity, a sound pressure or a surface vibration. The sensor signal 70 may basically be any physical quantity detectable by means of measuring technology. It may also be a measured temperature, in particular having a non-linear correlation, which is as static as possible, to an input signal 20. In particular, the sensor signal 70 includes measuring values, it is not the physical quantity itself, except for certain cases in analog/digital voltage signals at the output of the sink, since these are compatible with the input of the control unit. Not the surface vibration itself as a physical quantity can be input into the control unit, but only the measuring values detected by a corresponding sensor and, if applicable, processed. This fact should be obvious to a person skilled in the art, which is why it will not be discussed further. If a sink is purely digital/virtual, it may also only be numerical values which do not have a physical equivalent.

The suggested circuit 100 for compensating non-linearities essentially without changing a characteristic curve operating point and/or characteristic curve operating range comprises the alternating voltage signal source 10 for providing the input signal 20; the control unit 30 which receives the input signal 20 and converts the input signal 20 to a predistorted signal 20 by means of at least one preset predistortion parameter r; and the sink 50 for receiving the predistorted signal 40, wherein the sink 50 is coupled to an adjusting unit 60 configured to provide the sink 50 with an adjusting signal in order to operate the sink 50 in an operating range or at an operating point. The control unit 30 is configured to receive the at least one sensor signal 70 of the sink 50 in a feedback manner and to adapt the at least one preset predistortion parameter r based on the at least one sensor signal 70, which may also be referred to as sink output signal 70. In is conceivable for the at least one predistortion parameter r to be a real-valued variable. However, predistortion functions having several parameters are also conceivable. In this case, r may be a vector r or else the parameters would have to be indexed to read $r_1, r_2, \ldots, r_M$ for M parameters. The vector r could then be written as $r_m$ with m=1, 2, . . . , M, M being a natural number.

The control means 30 converts the input signal 20 to a predistorted signal 40 by means of the at least one adapted predistortion parameter to provide the sink 50 with the predistorted signal 40, without essentially changing the characteristic curve operating point and/or characteristic curve operating range. With the described control loop, the input signal 20 which is provided by the alternating voltage source 10, is applied to the input of the control unit 30 so that the input signal 20 can be predistorted with at least one adapted distortion parameter. Here, the sensor signal 70 is fed back in the control loop so that the predistortion parameters can be adapted. The input signal 20, however, is input into the control unit 30 all the time. Adjusting the at least one distortion parameter r is repeated in a loop, in particular in parallel to normal operation of the sink.

The predistorted signal 40 can exist with a DC portion or without DC portion and/or in a known range of values, wherein the range of values comprises a maximum value and a minimum value which the predistorted signal may take. If the predistorted signal is within the range of values, the operating range can be maintained. Since the minimum and maximum values of the input signal are usually known, the predistorted signal 40 can be kept within this range of values with absolute guarantee.

If the predistorted signal 40 comprises a DC offset, the control unit 30 is configured to change or remove the DC offset, in particular to calculate the DC offset by means of a mean value, using the at least one predistortion parameter r and subsequently to subtract the calculated DC offset from the predistorted signal 40 and/or remove it from the predistorted signal by means of a high-pass filter with a sufficiently deep cut-off frequency. A high-pass filter having a sufficiently deep cut-off frequency means that a bandwidth of the input signal 20 when passing the high-pass filter is maintained. The bandwidth of the distorted signal after a high-pass filter corresponds to the bandwidth of the original signal, i.e. of the input signal 20.

The predistorted signal 40 can contain a DC offset/DC portion if the operating range, for example, is to be maintained. If, however, the operating point is to be kept unchanged, no DC offset may be contained since it may add up with the DC signal of the adjusting unit 60. It is to be mentioned that, depending on how the sink is implemented, an addition of the DC offset of predistortion and adjusting unit does not necessarily take place. A DC offset usually is caused by the predistortion function. Depending on the target (operating point or operating range is maintained unchanged), it is removed or not. It is also conceivable to pursue both targets (operating point and operating range are maintained unchanged) so that complete removal of the DC portion is not put up with.

Figure 2:
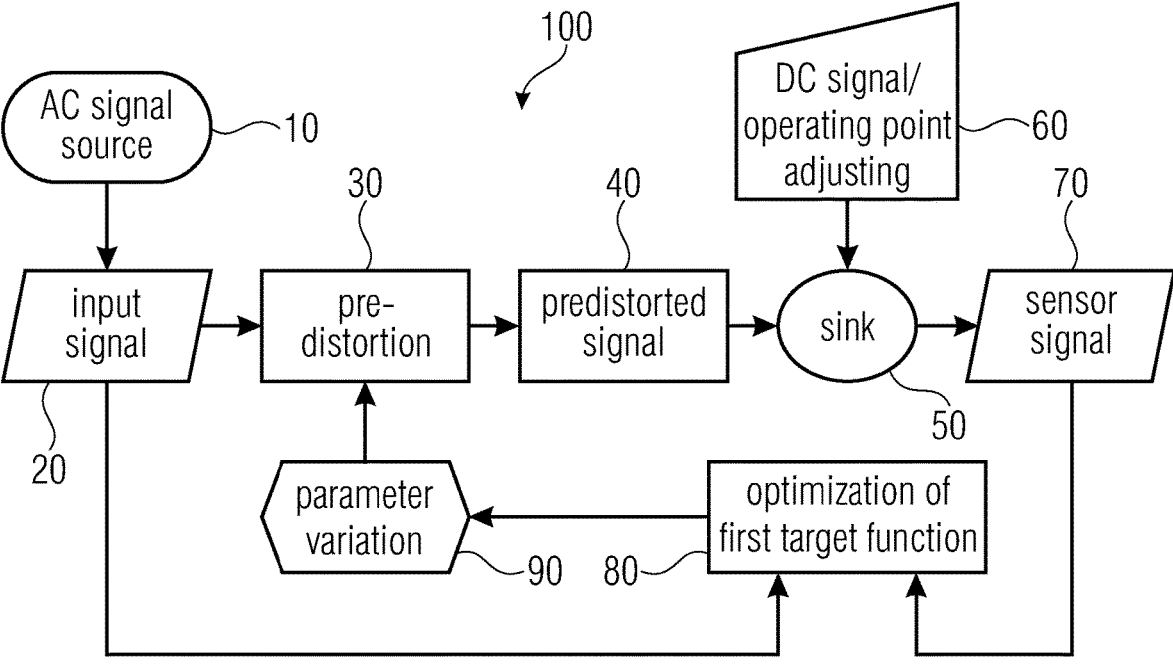
FIG. 2 shows a signal flow chart of the suggested circuit in accordance with a first variation.

FIG. 2 discloses a mode of functioning of the control unit 30 in a first variation for operating the suggested circuit in accordance with a suggested method. The first variation follows a feedback-based control paradigm. The predistortion parameter(s) r/r is/are changed such that a first target function 80 is minimized. Parameter variation 90 takes place here. The first target function 80 is calculated at least based on the sensor signal 70 or sensor signals 70 or additionally using the known input signals 20. In particular, the error function 80 will always map the non-linearity of the sensor signal 70 relative to the input signal 20 in some way. Different measured values/target functions may be selected for this. Two examples are explained below:

First example. If the input signal 20 consists only of sinusoidal tones with known frequency, the total harmonic distortion, the distortion factor and intermodulation distortion can be calculated only based on the sensor signal 70. These distortion values would then have to be minimized.

Second example. Alternatively, using both the sensor signal 70 and the input signal 20, the relation between the two signals can be considered, in particular (non-) coherence. Thus, the total non-coherent distortion (TNCD) can be calculated for complex input and sensor signals, for example, which then would have to be minimized.

The first target function 80 is defined such that minimization results in a reduction in the non-linear distortion portions at the output of the sink 50. When minimizing the target function 80, non-linear predistortions at an output of the circuit 100, i.e. the sink 50, are reduced by means of predistortion of the signal. Functions which calculate measured values of characterizing non-linearity of a system are suitable as a first target function 80.

Advantageously, the controller 30 is configured to normalize the predistorted signal 40 in order to keep the predistorted signal 40 at the output of the controller 30 in the original operating range of the input signal 20, wherein, in particular, the original normalized operating range is at $-1 \leq x \leq 1$. The operating range is usually known, thereby allowing normalization thereof.

The at least one sensor signal 70 of the sink 50 may comprise a measured output voltage and/or output current intensity and/or sound pressure and/or surface vibration and/or the same.

Advantageously, the adjusting unit 60 shown, for example, in FIGS. 1 and 2, is a direct voltage source which provides the adjusting signal as a direct voltage for the sink 50. An operating point and/or operating range are preset or adjusted by the adjusting signal provided at the sink 50. The term operating range on the one hand indicates the alternating voltage operating range of the input signal and the predistorted signal, which may be, for example, between −1 and 1 V. In relation to only the alternating voltage, this operating range at the sink is maintained, however, is shifted by the DC offset resulting from the adjusting signal. The result could, for example, be an operating range between 9 and 11 V at an adjusting signal of 10 V. Thus, the adjusting signal influences the "positioning" of the operating range on a characteristic curve, the "stroke" (of ±1 V, for example), however, is preset initially by the input signal 20 and/or in the end by the predistorted signal 40. The operating range may thus be understood to be the signal stroke or absolute values. Such a differentiation is sufficiently known to the person skilled in the art.

By means of the adjusting signal, which particularly is an arbitrarily selected direct voltage, the sink 50 comprises a fixedly preset operating point or operating range, or only changing slightly depending on the application. In the present case, the term "slightly" is to be understood to mean "slowly over time", wherein "slowly over time" means that the change in the operating point is so slow and takes place to such an extent that optimization of the predistortion parameters, which takes place in parallel to normal operation, can converge (at least approximately). The speed of convergence depends mainly on hyper-parameters of optimization, the non-linear characteristic curve of the sink and the statistical properties of the input signal. In case of a changing operating point, the speed of convergence is additionally dependent on how strongly/by which magnitude the operating point is shifted. Too quickly successive, too strong changes prevent convergence and thus a suitable predistortion. Frequently, changes in operating point occur quickly and, at the same time, strongly (see description above). This in turn means that changes in operating points cannot be tracked continuously and, thus, optimization of the predistortion parameters or parameter variation 90 would fail.

Advantageously, the controller 30 is configured to change the at least one predistortion parameter based on the at least one sensor signal 70 such that the first target function 80 is minimized, in particular that the first target function 80 is calculated based on the at least one sensor signal 70 or based on the at least one sensor signal 70 and based in the input signal 20. As described before, the at least one predistortion parameter r may be a real number or be indicated by a vector or by an M tuple $((r_1 \ldots r_M))$.

Additionally, the first target function 80 may comprise a function or functions which determine a measured value or measured values of characterizing the non-linearity of a system. A measured value is, for example, a distortion factor or total harmonic distortion (THD) or total non-coherent distortion (TNCD). Further measured values may be: intermodulation distortions, THD+N (THD+noise), generally cross-correlation-based methods (among others, TNCD).

The first target function 80 may, for example, be extended by a measure of a change in level, in particular a loss in level or an increase in level, at the output of the sink 50. Thus, when optimizing, weighting between non-linear distortions 40 and level losses may take place. The predistortion may result in a considerable change in level, both upwards and downwards, in particular depending on the specific combination of predistortion function and characteristic curve of the sink. In order to detect a change in level, in an input signal with a temporally constant level, the output level with and without predistortion is detected so as to obtain a measure of the change in level. Optimization may take place based on data of a certain frequency range. This frequency range may, for example, be within a useful signal bandwidth, but may also be, partly or completely, outside a useful signal bandwidth. An example of this would be a conventionally used ultrasonic range in audio applications. The audio or hearing sound frequency range is generally assumed to be 20 Hz to 20 kHz. In a non-linear system having an at least largely frequency-independent characteristic curve, a signal for characterizing non-linearity of the system may be introduced above the 20 kHz, but is in the no longer perceivable ultrasonic range. This may take place also in addition to the normal audio signal. The useful frequency range may, depending on the application, also be defined differently, for example between 0.1 Hz and 10 Hz, in this case the frequency range above 10 Hz may, for example be used for observing non-linearities. Such test signals are also conceivable for the frequency range below the useful frequency range, for example in an audio application of infrasound below 20 Hz. This method may be of advantage since the useful frequency range has to be loaded to a smaller extent/not at all. Optimizing the first target function 80 may be performed in different ways: Depending on the selected first target function 80 and implementation of the input signal 20, either classical optimization methods for finding local minimums in the parameter space and along the temporal axis, like a gradient method may be used, or else more complex methods for finding global minimums in the parameter space and along the temporal axis are used, which may be, for example, from the region of embedded optimization.

The first target function 80 may also be minimized by means of an adequately adjusted extreme value regulator for any input signals. Adequately here means that the hyper parameters of the extreme value regulator are adjusted such that convergence for any application-relevant signals with any features (quasi-static, impulse-like, speech or music-like, stochastic) is very probable.

Optimizing the first target function may, for example, take place once, continuously, in certain time intervals or when exceeding a threshold value of the first target function.

Advantageously, the controller 30 is configured to minimize the first target function 80 by means of a mathematic optimization method, in particular the controller 30 is additionally configured to select the mathematical optimization method based on properties of the input signal, or to minimize the first target function by means of adequately adjusted extreme value regulators. Extreme value regulators are a sub-group of optimization methods which are suitable for the application on which the invention is based, since they can be used online and, at the same time, have a hardly perceivable negative influence when minimizing the target function. Extreme value regulators continuously estimate the gradient in the respective control variable operating point and change the control variable correspondingly so that the target function 80 in minimized or maximized. If hyper parameters of an extreme value regulator are adjusted favorably, regulation will also converge with most different changing input signals, which is of great importance for usage during normal operation.

The input signal 20 may be considered in the target function 80. The target function 80 may consequently exhibit a dependence on the input signal 20. The type of the optimization method may be selected based on the properties of the input signal 20. For example, selecting the optimization method may take place automatically, at least up to a certain degree. If, for example, a static input signal 20, like a continuous sinusoidal tone, is detected by the controller 30, a classical gradient method may be selected automatically. The classical gradient method is sufficient for static input signals 20. If, for example, a varying/any input signal 20 is detected by the controller 30, a global optimization method, in particular a temporally dependent one, is selected automatically, like embedded optimization, genetic algorithms, extreme value regulator, for example. In particular, extreme value regulators are global only temporally and local relative to the target function.

Advantageously, the controller 30 is configured to weight the first target function 80 as regards non-linear distortions and a, in particular optional, change in level at an output of the sink 50, if the first target function 80 comprises a measure of the change in level at the output of the sink 50. The term change in level comprises both a loss in level and an increase in level, which may both result in undesired effects, so that weighting of the target function may be sensitive at this point. The optional adaptation in level, in particular the increase in level 39, may change the operating range since the maximum and minimum values of the predistorted signal 40, 40a, afterwards may exceed or fall below the input value range, the operating point, however, is maintained.

Advantageously, the controller 30 is configured to minimize the first target function 80 on the basis of an iteration of at most N–1 predistortion iteration steps of different orders, N being a natural number greater than 1. Advantageously, the predistortion iteration steps are performed in increasing order. It is also conceivable to omit certain orders or only start at a higher order of n>2. For example, 2, 3, 4, 5 is an increasing order with no omission and 2, 4, 5 is an increasing order while omitting order 3.

The following example explains in greater detail what is meant by omitting an order or beginning at a higher order. For example, the sink 50 may predominantly exhibit predistortion portions of third and sixth order. The result of this would be that the predistortion cascade would intuitively consist only of orders 3 and 6, but it could consist of orders 3, 4, 5, 6, 7, 8, . . . or 3, 4, 6, 8, 9, 12, . . . . The different cascades are not exactly equivalent in their effect, but when converging to a global minimum of the first target function, the different cascades have a similar effect. Depending on the characteristic curve to be compensated, it may be of advantage to consider many different orders in the cascade. It is important that the lower-order predistorted signal 40 is the input signal for the higher-order predistortion. Here, the cascade will always be increasing. It is also to be mentioned here what is meant by different orders. For example, a second-order harmonic distortion has double the basic frequency (=first harmonic), whereas a third-order harmonic distortion exhibits a triple basic frequency (=second harmonic), etc. In harmonic distortions, the order n of the distortion thus indicates that the n–1 harmonic is included.

FIG. 3 schematically shows a controller 30 including possible components of the predistortion block 32 using the example of the first variation. The predistortion block 32 comprises N–1 predistortion iteration steps, wherein a parameter variation 90 is performed in each predistortion iteration step. The predistortion block 32 thus comprises a predistortion cascade, comprising the second-order predistortion iteration step to the nth-order predistortion iteration step, N being a natural number greater than 1. FIG. 3 shows a cascade of increasing order with no omissions.

In other words, the predistortion block 32 in FIG. 2 consists of a cascade of N–1 predistortions of different orders, starting with order 2 and ending with order N. Each predistortion is to be understood to be an iteration step of an iteration. These predistortions or iteration steps of different orders may be referred to as functions $v_2$ to $v_N$. The predistortions are arranged in series in increasing order so that a predistortion of a certain order will each process the predistorted signal of the next lower order. Expressed in mathematical terms, a predistorted signal $\hat{x}_{ges}$ 40 may be described by the following expression:

$$\hat{x}_{ges} = (v_N \circ v_{N-1} \circ \ldots \circ v_2)(x),$$

with the input signal x and the finally predistorted signal $\hat{x}_{ges}$. The parameters of the predistortions of different orders n are either adapted to the characteristics of the sink 50 one after the other or in parallel by means of multi-dimensional optimization of a first target function 80.

Advantageously, the controller 30 is configured to output, after performing the iteration, in particular as is shown in the predistortion block 32, a predistorted signal 40 to transfer it to the sink 50 which particularly transfers the sensor signal 70 to the controller 30. Conceivable sinks using which the method works well are, among others, amplifier circuits, individual electronic devices like transistors, or electromechanical transducers like dielectric elastomer actuators and electrostatic actuators. In the field of audio systems, all these types of sinks may be applied. Applying the method is, however, explicitly not restricted to the audio field.

Figure 10A:
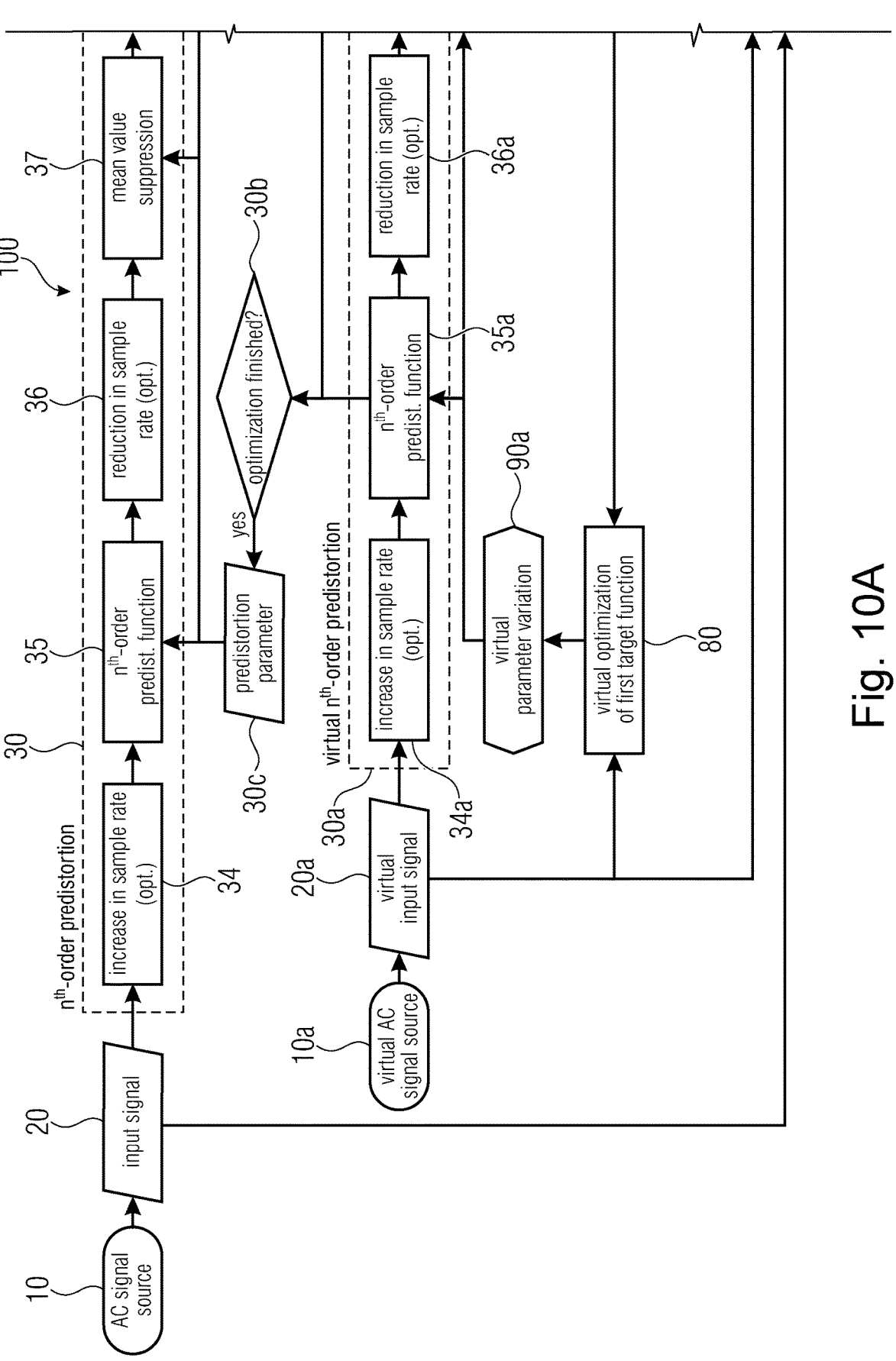
FIGS. 10A and 10B show a more detailed signal flow chart in accordance with FIGS. 9A and 9B.
Figure 10B:
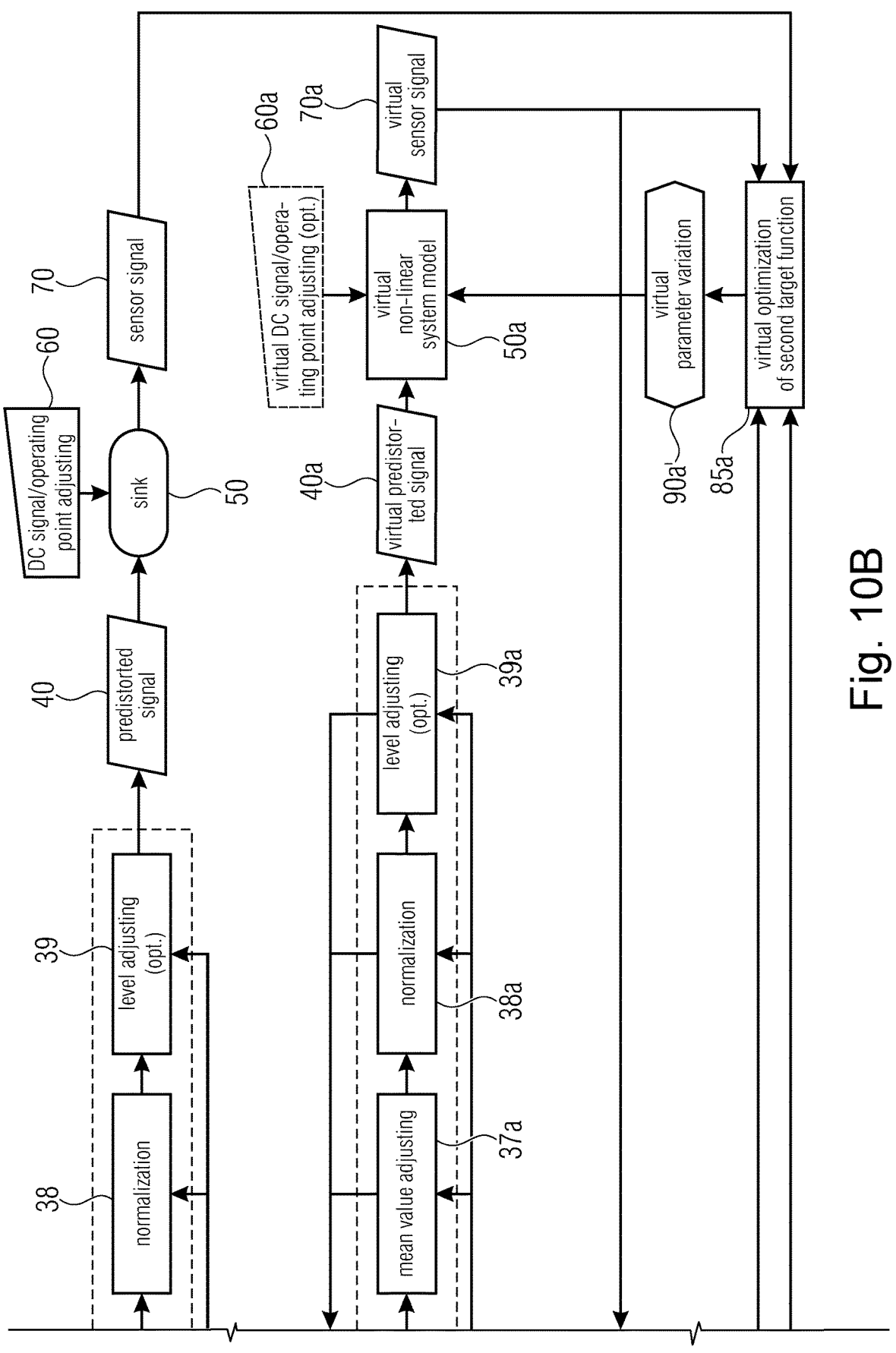

FIG. 4 schematically shows potential components of a predistortion of n-th order $v_n$. The possible components comprise different functions which may be executed by the controller 30. For example, optionally, an increase in sample rate 34 and a reduction in sample rate 36 may be performed. In particular, an increase in sample rate 34 is performed before an nth-order predistortion function 35, n being a natural number greater than 1. In addition, a reduction in sample rate 36 particularly takes place after a predistortion function 35 has been applied. After an nth-order predistortion function 35, a mean value adaptation, in particular mean value suppression 37, as is shown in FIG. 4, is performed by or in the controller 30, and subsequently normalization 38 of the predistorted signal 40, before the predistorted signal 40 is transferred to the sink 50. If the operating point is to be maintained, the DC portion of the predistorted signal 40 has to be removed/suppressed, which is done by subtracting a calculated mean value and/or high-pass filter (here, mean value suppression takes place, as is shown in FIG. 4). If, however, the operating range is to be maintained, the DC portion does not have to be removed completely, but be adapted in a certain way. Thus, in this case, a value for adapting the DC portion of the predistorted signal is calculated (in this case, mean value adaptation then takes place, as is shown in FIGS. 10A and 10B). Mean value calculation for removing/suppressing the DC portion and calculating the value for adapting the DC portion and thus the used mean value adaptation can be calculated using the predistortion parameters r. In other words, both the mean value suppression and the mean value adaptation, and the respective (mean) values can be calculated completely based on the predistortion parameter r. Maintaining the operating point or the operating range represents extreme values between which movement may take place by correspondingly adapting the DC portion. Mean value adaptation 37 and normalization 38 together may also be understood to be compensation of a DC offset. Mean value adaptation has an effect on the DC portion of the predistorted signal 40. Normalization has an effect both on the DC portion if the DC portion is still to exist after mean value adaptation, and the AC amplitude. If the DC portion is still to exist, it is multiplied by the normalization, as is the AC amplitude. The two together result in maintaining the operating point or operating range or in approximately maintaining the operating point and operating range. In the case of mean value suppression, which will occur if the operating point is to be maintained, mean value adaptation alone has the effect of "compensation of a DC offset". The DC offset is introduced into the predistorted signal 40 by the predistortion function 35. Optionally, before passing on the predistorted signal 40, a change in level, in particular an increase in level or reduction in level, may be performed. For example, FIG. 4 optionally shows an increase in level 39. The increase in level 39 is an example of level adaptation 39. Mean value suppression 37 comprises calculating a mean value and subtracting the calculated mean value from the predistorted signal 40. Additionally, mean value suppression may use a correspondingly tuned high-pass filter, in particular with no loss in bandwidth. Mean value adaptation, however, comprises calculating a value for adapting the DC portion of the predistorted signal 40 and subtracting the calculated value from the predistorted signal 40.

As is indicated in FIG. 4 by the arrows, the steps of predistortion 35, mean value suppression 37, normalization 38 and, optionally, increase in level 39 result in a parameter variation 90. In steps 35, 37 and 38, one and the same set of parameters is used. Step 39, i.e. level compensation, uses an additional parameter g. However, the parameter g may also be considered to be a predistortion parameter and be considered to be among the $r_M$ parameters. This means that the entire predistortion block with steps 34 to 39 uses one and the same set of parameters, in particular varied for optimization.

As is illustrated in FIG. 4, the different steps 34 to 39 are performed with each predistortion of orders 2 to N, as is illustrated in the predistortion block 32 of FIG. 3. FIGS. 3 and 4 each show, in somewhat different details, how the controller 30 is configured to operate. In particular, FIGS. 3 and 4 together show how the controller 30 is configured to operate.

If the AC input signal 20 is not sufficiently band-limited to largely suppress temporal aliasing, such aliasing, which may occur due to the following non-linear signal processing, in particular in accordance with step 35, can be avoided by means of an optional increase in sample rate 34. The correspondingly band-limited signal is then processed by an n-th-order predistortion function 35. An n-th-order predistortion function 35 is such that, above all, but not exclusively, non-linearities of the following form:

$$y=(a+bx)^n$$

are compensated at least approximately. Thus, the coefficients a and b, the output signal y and the input signal x are real numbers and n≥2 is a natural number which describes the order of non-linearity. Possible predistortion functions which fulfil this purpose, can be described by the following equations:

$$\hat{x} = \text{sgn}(r)\sqrt{|r|} + \frac{1}{\sqrt{|r|}}x, \quad r \neq 0, -1 \leq x \leq 1,$$

$$\bar{\bar{x}} = \text{sgn}(\hat{x})\sqrt[n]{|\hat{x}|}.$$

Thus, the parameter r≠0 and the non-linearly processed signal $\bar{x}$ are real numbers. If there is an optional increase in sample rate 34 before the n-th-order predistortion function, an optional reduction in sample rate 36 may take place afterwards, for example, to bring the signal back to the original sample rate. With these equations, boundary conditions are important since the predistortion functions described by this may generally only work optimally with input signals within this range of values. The input signal 20 may consequently at first have to be brought to this range of values, in particular normalized range of values and later on has to be brought back to the original operating range by normalization of the then predistorted signal 40. The predistortion function 35 may introduce a DC offset into the signal $\bar{x}$, which is removed subsequently, in particular, to maintain the operating point. This may, for example, be performed by means of a high-pas filter of a sufficiently deep cut-off frequency (not shown) and/or, for example, by mean value calculation using the predistortion parameter rand subsequent subtraction (as is shown in FIG. 4). In order to keep the predistorted signal 40 $\hat{x}_n$ of nth order at the output of the nth-order predistortion in the original operating range of the input signal, the signal is subsequently normalized (see step 38 in FIG. 4). The suitable normalization factor may, for example, be calculated using the predistortion parameter r. If the operating range of the sink 50 allows exceeding the operating range [−1;1] of the input signal 20 by $\hat{x}_n$, by means of an optional increase in level before the output of the n-th-order predistortion, a potential loss in level at the output of the sink can be compensated. An optional real predistortion parameter g serves for controlling the optional increase in level. An n-th-order predistortion may thus, while considering the parameters r and g, generally be described as $\hat{x}_n=v_n(x,r,g)$.

As can already be gathered from the description, the at least one predistortion parameter comprises several predistortion parameters r. The predistortion parameter r may particularly be understood to be a vector quantity. The nth-order predistortion function may have one or more parameters. Like in the above example, the predistortion parameter, expressed by r, is, for example, a real number. In other functions, it may also be $r_1, r_2, \ldots$ Additionally, the distortion parameter r as a vector quantity may comprise an optional g for level compensation, which can also be considered as a further $r_k$ (k from 1 to K). In this case, each different-order predistortion has K parameters. The predistortion block then comprises L (L equaling at least one, at most N−1) predistortions with K parameters each. The overall number of predistortion parameters would in this case be M=K*L.

As is also indicated in FIG. 3, the controller 30 is configured to adapt the predistortion parameters r of each of the, in particular, L predistortion iteration steps, wherein 1<=L<N, to characteristics of the sink 50 either in an increasing order temporally one after the other by means of a one-dimensional optimization or parallel in time by means of multi-dimensional optimization of the first target function 80. The number of iteration steps is largely independent on the maximum order N, since not all the orders n (as discussed already) have to be contained in the cascade.

Figure 5:
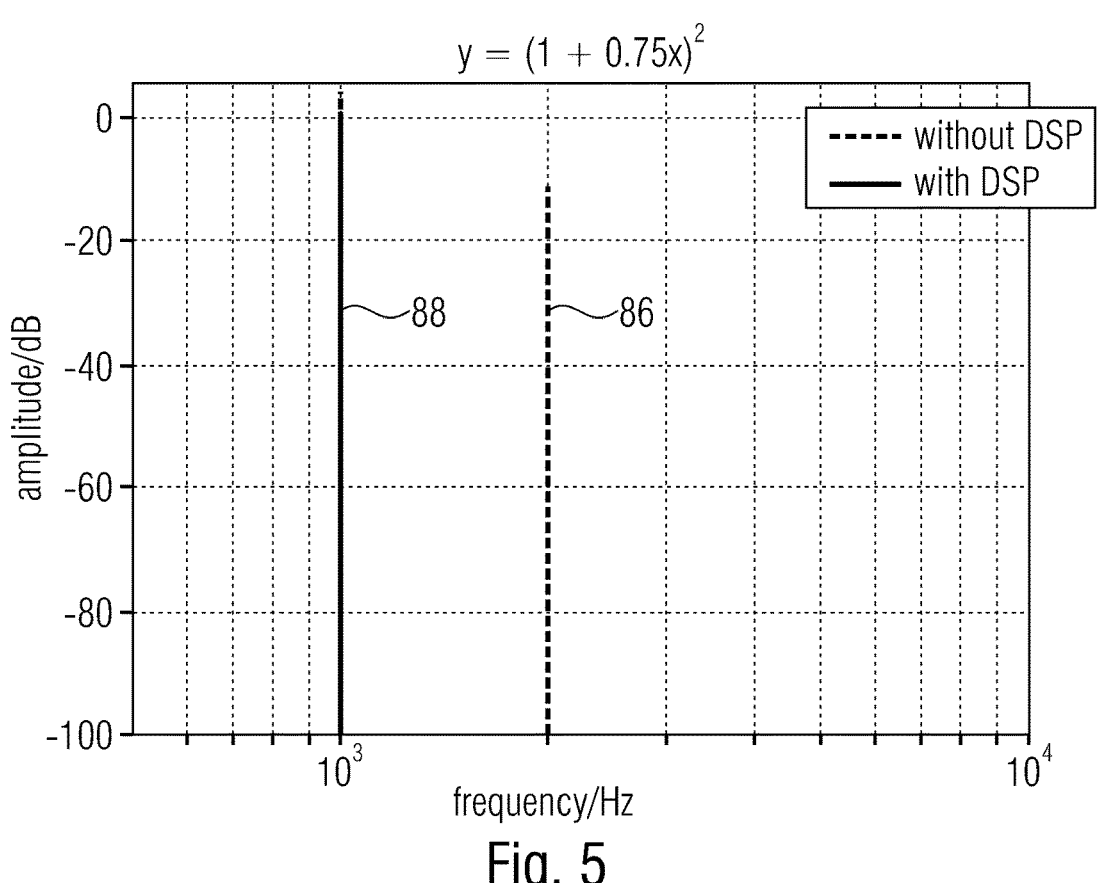
FIG. 5 shows simulation results without level compensation for the first variation of the method.
Figure 6:
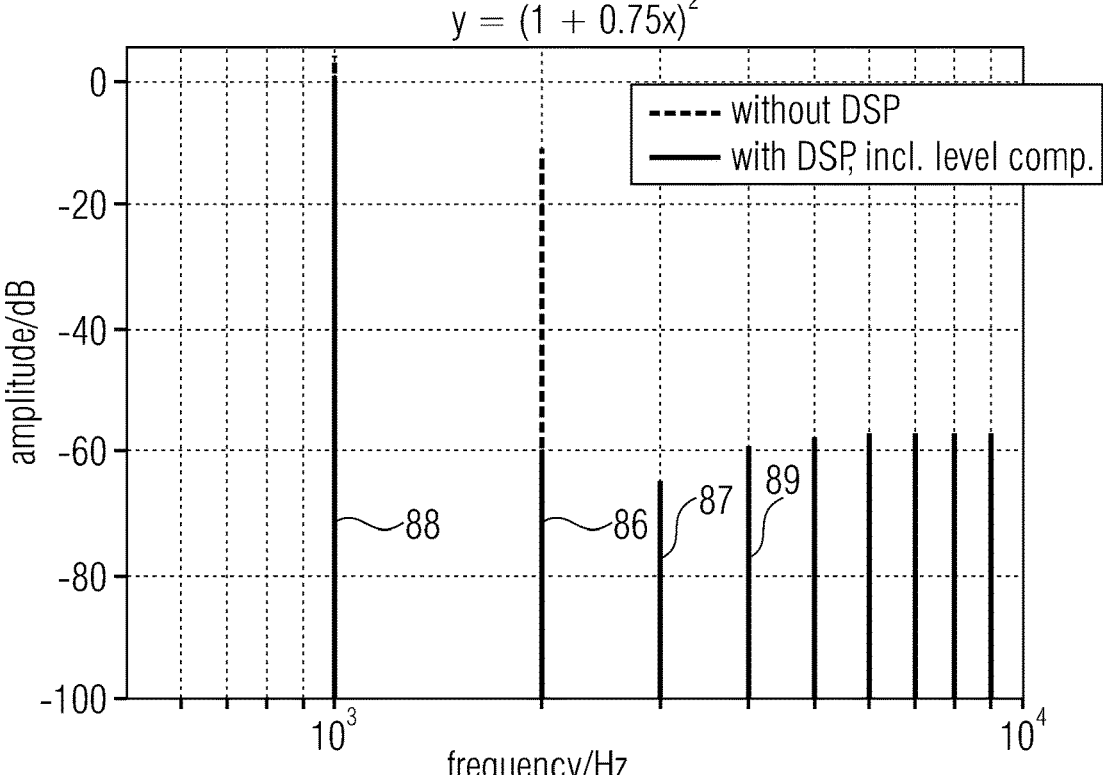
FIG. 6 shows simulation results including level compensation for the first variation of the method.
Figure 7:
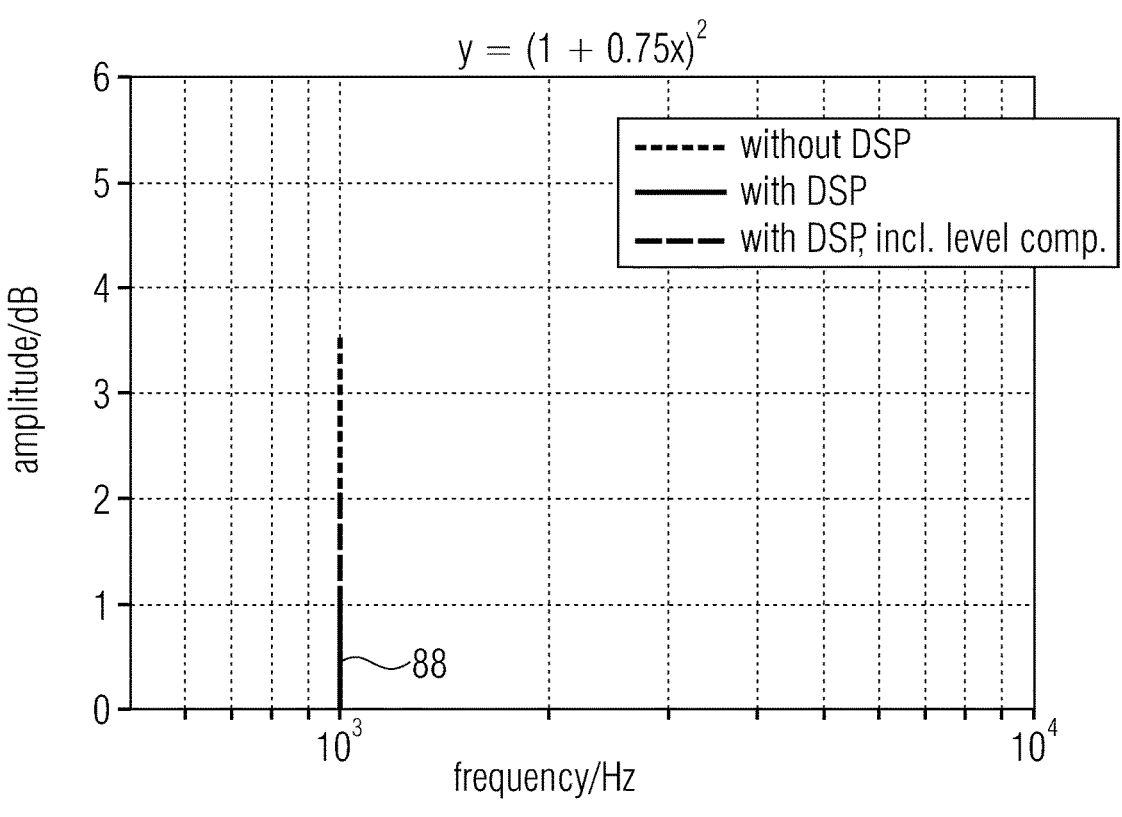
FIG. 7 shows simulation results including level compensation for the first variation of the method.

FIGS. 5 to 8 each show simulation results obtained using the suggested circuit 100 in accordance with a method as is shown in FIGS. 3 and 4. FIGS. 5 to 8 show the basic effectivity of predistortion. The non-linearity on which FIGS. 5 to 8 are based so as to obtain the simulation results, is represented in the corresponding figures. The simulated amplitudes with the unit dB are each plotted over frequency in Hz. FIGS. 5 to 7 each show, using simulations, the influence of the method on the simulated sensor signal 70 of a simulated non-linear system with the characteristic curve $y=(1+0.75x)^2$ with a 1-kHz sinusoidal tone with a peak value 1 as the input signal 20. "Without DSP" in the description of FIGS. 5 to 8 means that the method was not applied to the simulated non-linear system.

FIG. 5 thus represents the simulated sensor signal 70 without the effect of the method (without DSP) compared to the simulated sensor signal 70 using the method (with DSP). FIG. 5 shows a marked reduction in the amplitude of the second harmonic 86 by more than 80 dB, whereas the amplitude of the basic frequency 88 is reduced only by approximately 2.5 dB.

FIG. 6 represents the simulated sensor signal 70 without the effect of the method (without DSP) compared to the simulated sensor signal 70 using the method including level compensation (with DSP, including level comp.). FIG. 6 still shows a marked reduction of the second harmonic 86 by roughly 50 dB, whereas the loss in level at the basic frequency 88 is only approximately 1.5 dB. It can be recognized that additionally higher-order harmonics are generated, each with approximately −60 dB amplitude relative to the amplitude of the basic frequency 88. This illustrates the weighting between loss in level (at the basic frequency 88) and non-linear distortions in the sensor signal 70.

FIG. 7 illustrates the different amplitudes of the basic frequency 88 in the simulated sensor signal 70 without the effect of the method (without DSP), using the method without optional level compensation (with DSP), and using the method including level compensation (with DSP), including level comp.). The loss in level without DSP, per definition, is 0 dB, roughly 2.5 dB with DSP and roughly 1.5 dB with DSP, including level comp.

Figure 8:
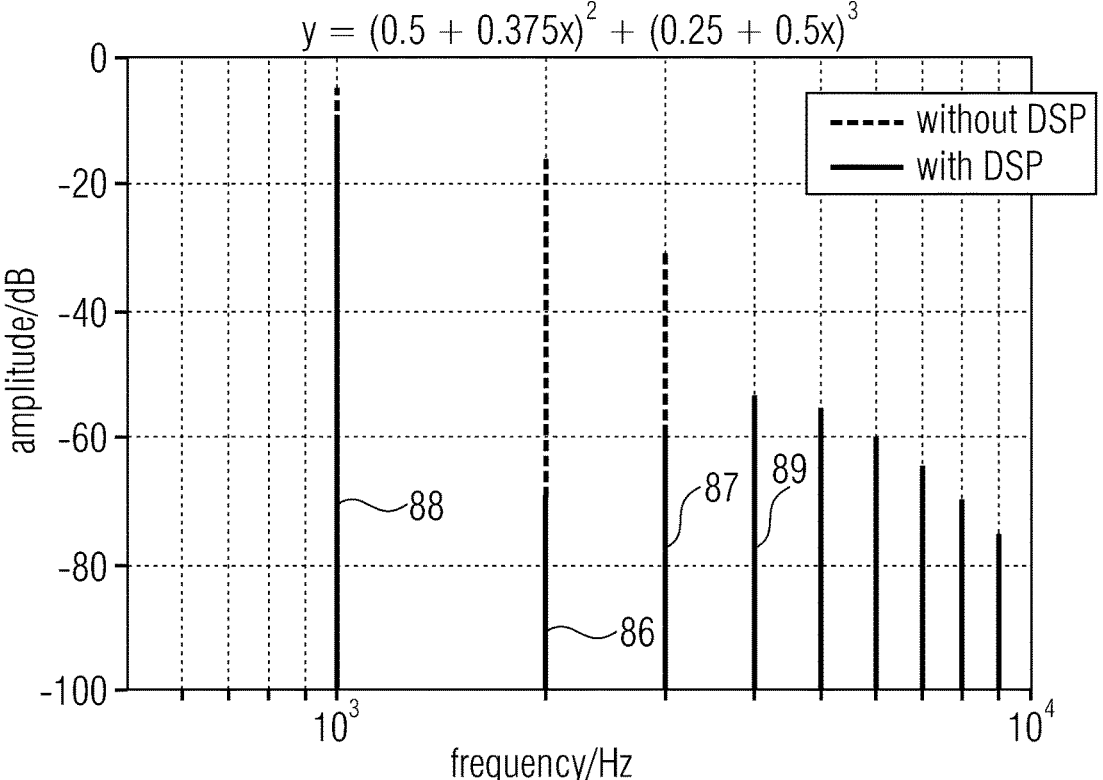
FIG. 8 shows simulation results including level compensation for the first variation of the method.

FIG. 8 shows, using a simulation, the influence of the method on the simulated sensor signal 70 of a simulated non-linear system with the characteristic curve $y=(0.5+0.375x)^2+(0.25+0.5x)^3$. The marked reduction of the second harmonic 86 by roughly 55 dB and of the third harmonic 87 by roughly 25 dB using the method (with DSP) can be recognized. The level of the basic frequency 88 decreases by roughly 5 dB. The predistortion additionally generates higher-order harmonics, wherein the highest amplitude (fourth harmonic 89) is roughly −45 dB relative to the amplitude of the basic frequency 88.

It is to be pointed out when looking together at FIGS. 5 to 8 that the two simulated systems (FIGS. 5 to 7 and FIG. 8) differ greatly (cf. second order of characteristic curves in FIGS. 5 to 7 versus third order of the characteristic curve in FIG. 8, and different polynomial coefficients), wherein most different graphs result already "without DSP".

In FIG. 5, the method with only a second-order predistortion has been applied, in FIG. 8 with a cascade of second and third order. The resulting predistortion parameters r also differ due to these facts. The mutual effect between the respective non-linear system and the respective predistortion consequently is quite different.

Figure 9A:
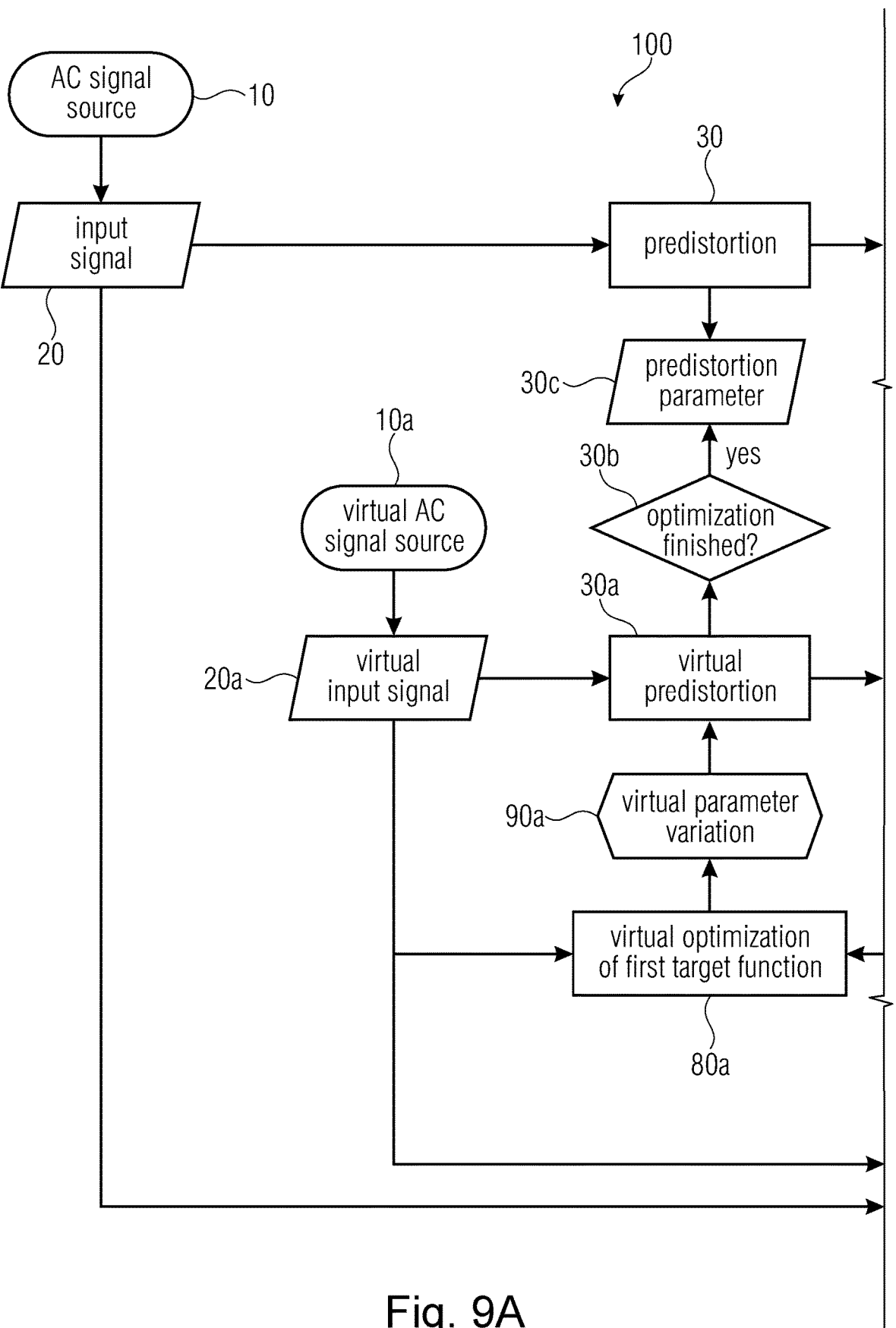
FIGS. 9A and 9B show a signal flow chart of the suggested circuit in accordance with a second variation.
Figure 9B:
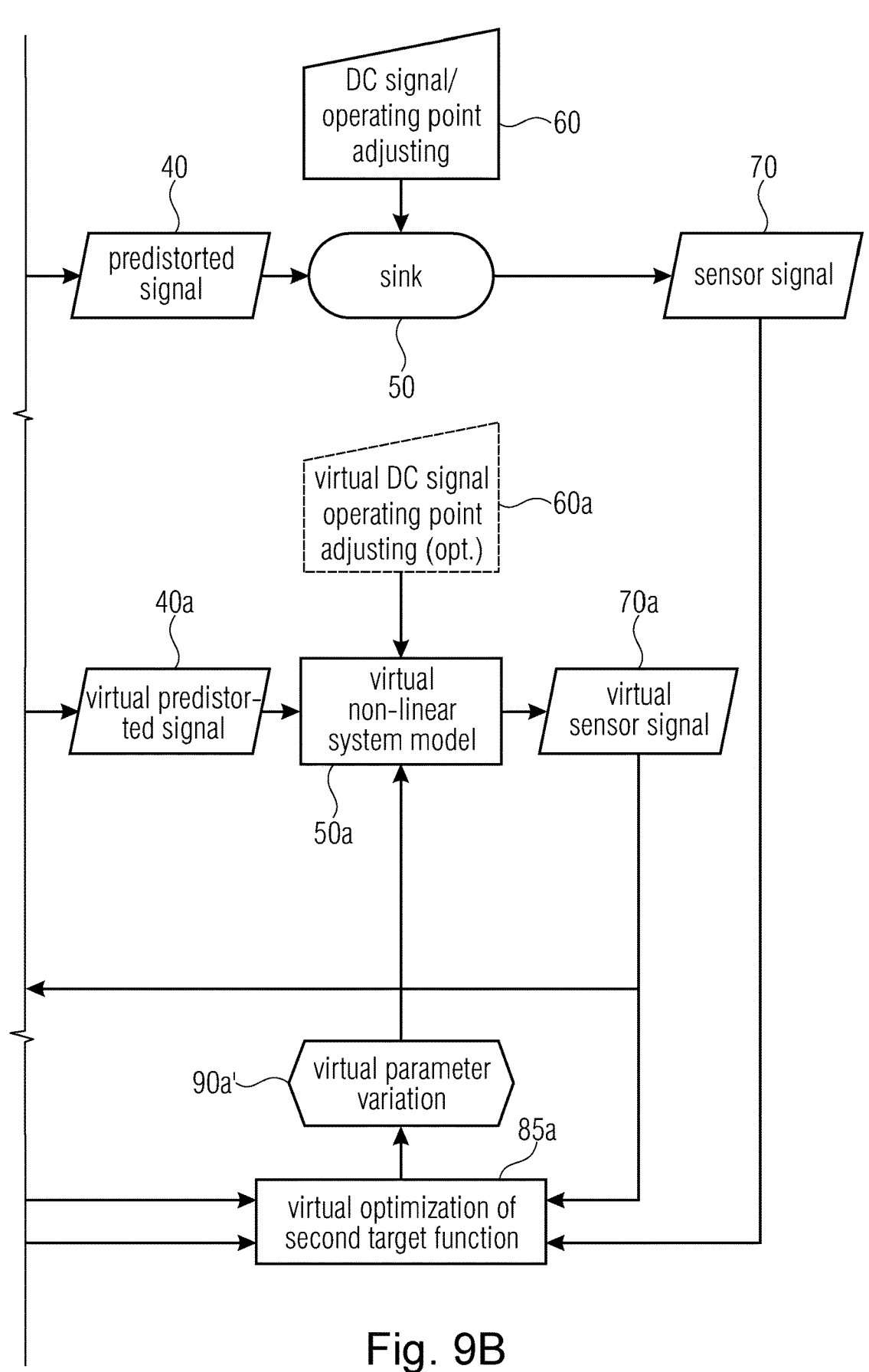

FIGS. 9A and 9B show the components of the control unit 30 of a second variation of the method. The second variation follows an adaptive control paradigm (adaptive feed forward control). In contrast to the first variation of the method, in the second variation, a method 100 which nearly corresponds to the first variation is performed virtually in the controller 30. The virtual components each have the same reference numerals as the real components, supplemented by the letter "a" (see FIGS. 9 and 10). The virtual signal source consequently has the reference numeral 10a, whereas the real signal source has the reference numeral 10, etc. A further difference is that at first a second target function 85a is optimized virtually by adapting the parameter(s) of a non-linear system model 50a such that the deviation between the real sensor signal 70 and a virtual sensor signal 70a is minimized. Optimizing the second target function 85a takes place "on the side", without interfering in the operation of the sink 50 with the input signal 20 or predistorted signal 40, thus, the second target function 85a is optimized virtually. If this non-linear system identification is finished, similar to the first variation, a first target function 80a is optimized virtually in order to minimize the non-linear distortions at the output of the non-linear system model 50a. This is done while considering a loss in level.

The advantage of this procedure is that almost the entire optimization process takes place based on virtual signals and, consequently, largely independent of the real circuit 100. The optimization process does not have an effect on the standard operation of the circuit 100 which may continue in parallel. The duration of the optimization process is thus irrelevant. Optimizing the first target function 80a may be accelerated when compared to the first variation since not a real sensor signal 70 has to be waited for. After finishing all the optimizations, i.e. when optimization 30b is finished, the predistortion 30a is switched between real AC signal source 10 and real sink 50 by passing on the predistortion parameters to the control unit 30. Both the parameter(s) of the non-linear system model 50a and those of the predistortion 30, 30a may, for example, be adapted once, continuously, in certain time intervals or when exceeding threshold values of the first or second target functions 80a, 85a.

Advantageously, the controller 30, 30a is configured to minimize a second target function 85a by adapting at least one model parameter of a non-linear system model 50a such that a deviation between the real sensor signal 70 at an output of the sink 50 and the virtual sensor signal 70a at an output of the non-linear system model 50a or between a quantity derived from the real sensor signal 70 and a quantity derived from the virtual sensor signal 70a is minimized. Generally, it is to be pointed out that the "predistortion parameters" parameterize only the predistortions, in particular the nth-order predistortions. The "model parameters" are those adapting the non-linear system model 50a to the real sink 50. The model parameters thus also serve minimizing the second target function 85a. The non-linear system model may be realized and thus also be parameterized in most different ways. A simple, purely non-linear system model would, for example, be given by $y=ax^2$, with the parameter a, the input signal x and the output signal y. Conceivable non-linear system models 50a for the sink 50 thus range from pure polynomials via physically motivated state space models or block-based models operating using FIR/IIR filters (like Hammerstein model) up to (deep) neural networks, like LSTM-NNs. The more precisely the model is able to map reality, the better and more robust will the performance be when compensating non-linearities. Expressed in general, the algorithm disclosed here is, however, independent of the selected model.

The term "quantity derived therefrom" is to be understood such that it is conceivable, even if not necessarily equally target-oriented, to minimize, instead of the (temporally averaged) deviation between the measured sensor signal 70 (like the current intensity, for example), and the virtual sensor signal 70a (like a current intensity predicated by the model, for example), a deviation in the frequency range or the deviation between the respective measure of non-linearity derived from the measurement and from model prediction (THD, TNCD, . . . ).

Advantageously, the controller 30, 30a is configured to perform, after performing minimization of the second target function 85a, minimization of a first target function 80a, as described already for the first variation, to minimize non-linear distortions at the output of the non-linear system model 50a. It is to be pointed out that optimizing the first target function 80a and optimizing the second target function 85a are each performed virtually.

Advantageously, the controller is configured to output, after performing a, in particular virtual, minimization of the second target function 85a and the first target function 80a, a, in particular real, predistorted signal 40 to be passed on to the sink 50. By being able to virtually perform minimizing the first and second target functions 80a, 85a, this process of optimization does not have an influence on normal operation of the circuit 100.

FIGS. 10A and 10B, in analogy to FIG. 4, schematically shows potential components of a virtual predistortion of nth order $v_n$. The potential components comprise different functions which can be performed by the virtual controller 30a. For example, optionally, a virtual increase in sample rate 34a and a virtual reduction in sample rate 36a may be performed. In particular, a virtual increase in sample rate 34a takes place before a virtual n-th-order predistortion 35a, n being a number greater than 1. Additionally, in particular, a virtual reduction in sample rate 36a takes place after a virtual predistortion 35a. After a virtual n-th-order predistortion 35a, a virtual mean value adaptation 37a, in particular a virtual mean value suppression 37a, is performed by or in the virtual controller 30a, and subsequently virtual normalization 38a and, optionally, virtual level adaptation 39a, in particular virtual increase in level 39a, of the virtual pre-distorted signal 40a so that, if optimization is finished 30b, the determined predistortion parameters 30c are passed on to the controller 30, which then passes on the real predistorted signal 40 with the determined predistortion parameters 30c to the sink 50. Optionally, before passing on the real predistorted signal 40, a change in level 39, in particular an increase in level or reduction in level, may be performed. For example, FIGS. 10A and 10B optionally show an increase in level. Mean value suppression 37a comprises calculating a mean value and subtracting the calculated mean value from the virtual predistorted signal 40a. Mean value adaptation comprises determining a value for adapting the DC portion and subtracting this value from the mean value, without completely removing a DC portion. As is indicated in FIGS. 10A and 10B by the arrows, parameter variation 90a takes place virtually in the steps of predistortion 35a, mean value suppression/mean value adaptation 37a, normalization 36a and the optional step of increase in level 39a.

In FIGS. 10A and 10B, two loops can be seen, in which a respective virtual parameter variation 90a, 90a' takes place. A first loop comprises the signal path: virtual sink 50a (=non-linear system model 50a)->virtual sensor signal 70a->virtual optimization of a second target function 85a->virtual parameter variation 90a'->virtual sink 50a.

The second loop in FIGS. 10A and 10B comprises the signal path: virtual sink 50a (=non-linear system model 50a)->virtual sensor signal 70a->optimization of a first target function 80a->virtual parameter variation 90a->virtual controller 30a->virtual predistorted signal 40a->virtual sink 50a.

It is to be pointed out here that the explanations made already as to the first variation, can directly be transferred to the second variation. In particular, the embodiments which may be performed with real components of the circuit 100, may also be performed with virtual components of the circuit. The consequence is, for example, that the at least one virtual predistortion parameter r may be a real number or a vector quantity, etc., (see explanations of first variation). The explanations of the first variation will not be repeated again for the second variation. Rather, for the second variation, reference here is made to the explanations of the first variation.

In the first and second variations, the real input signal 20 may be divided into frequency bands by means of a filter bank, before predistortion, which may then be predistorted differently before being summed again to form a total signal.

Figure 11A:
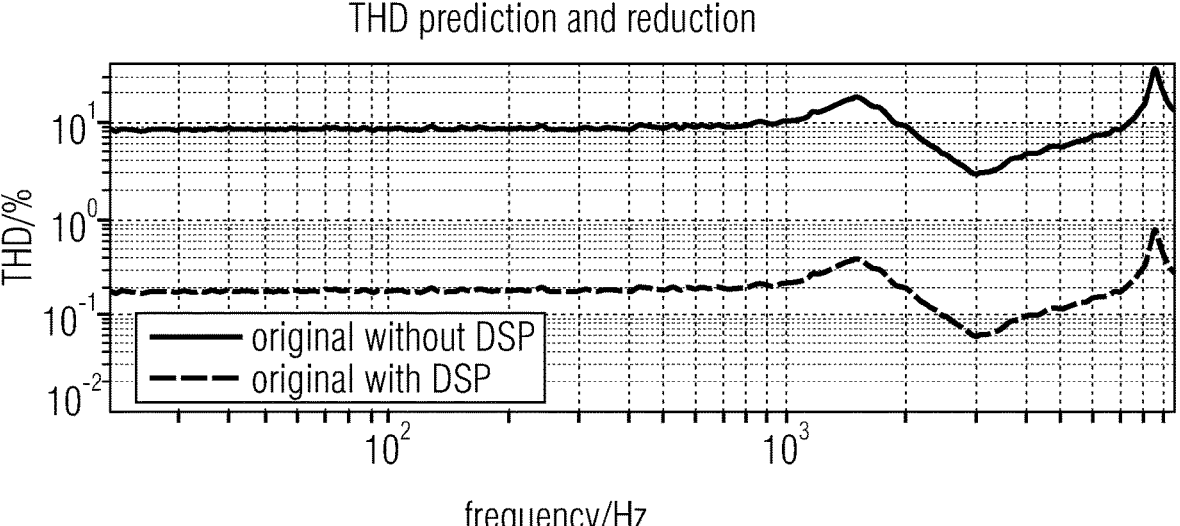
FIGS. 11A and 11B show simulation results for the second variation of the method.
Figure 11B:
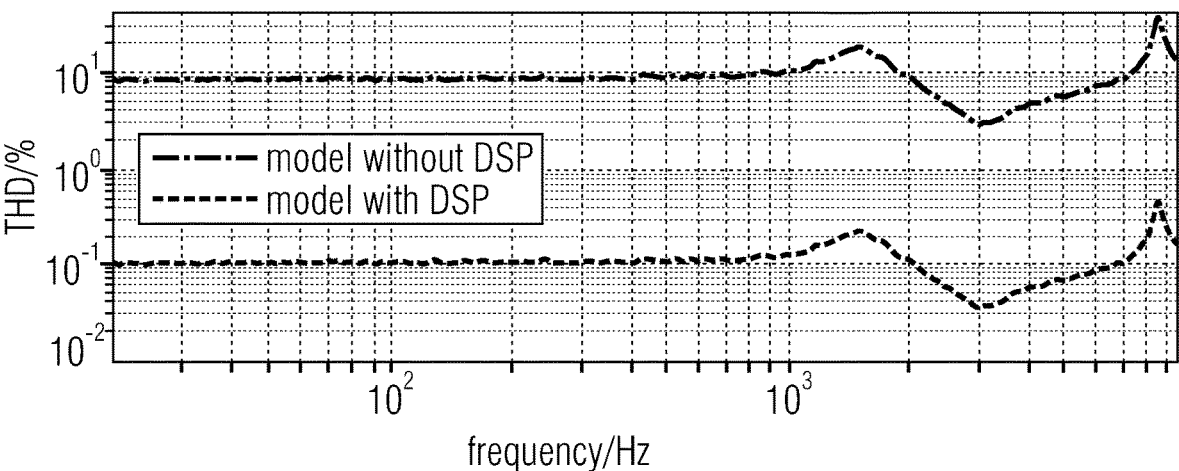
Figure 12:
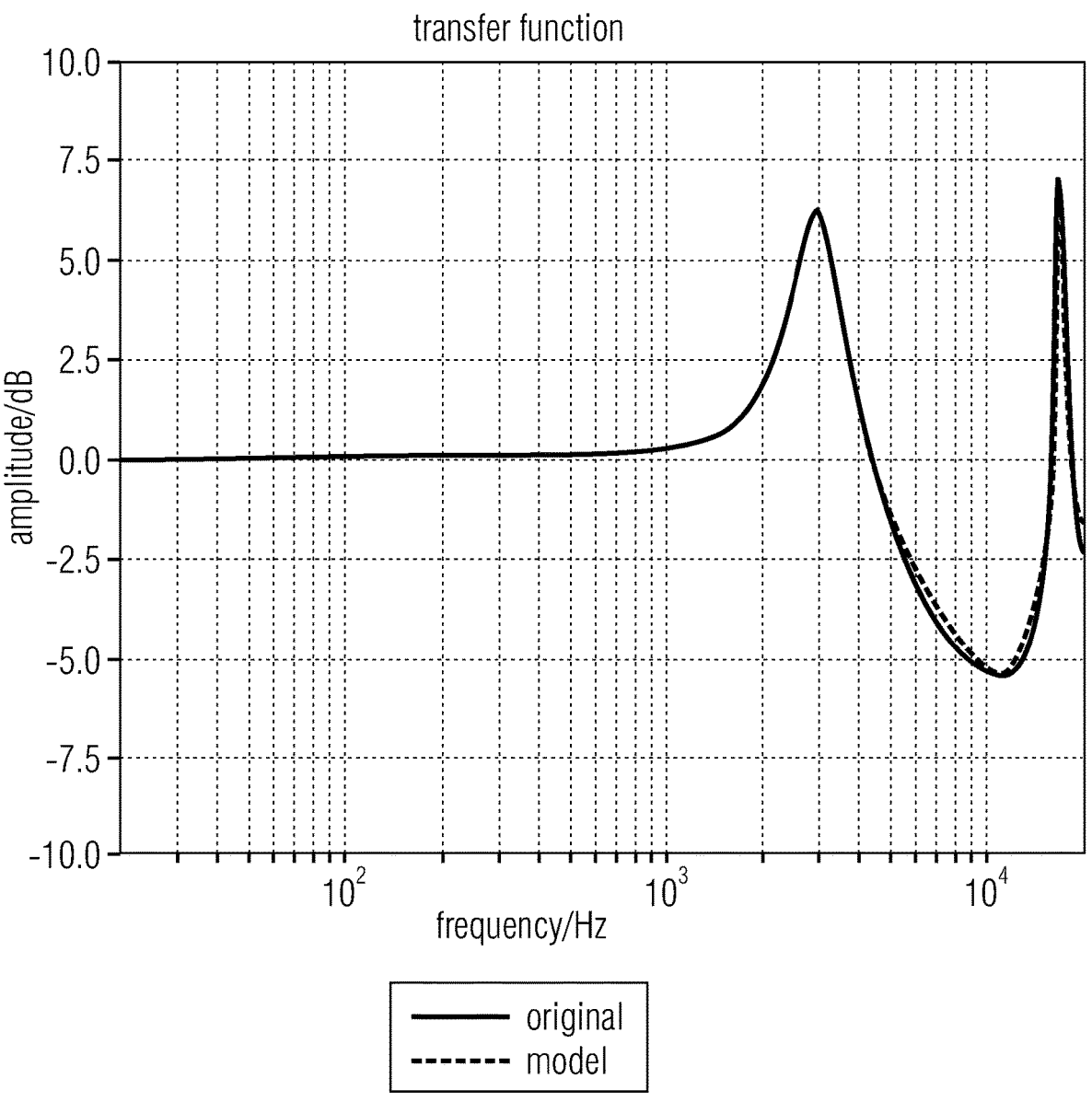
FIG. 12 shows simulation results for the second variation of the method.

FIGS. 11 and 12 each show simulation results for the second method presented here, which has been executed using the circuit 100. FIG. 11, in FIGS. 11A and FIG. 11B, shows THD prediction and THD reduction relative to the frequency in Hz. FIG. 11 is subdivided into FIGS. 11A and 11B, since, when representing the graphs in one figure, these would overlap each other so that they could not be differentiated. FIG. 11A shows the THD values of the original simulated non-linear system ("original") without and with applying the second variation of the method ("DSP"). The THD values of the original simulated non-linear system without DSP are approximately between 3% and 35% and, with DSP, approximately between 0.06% and 0.7%. This means a reduction by the factor 50 or approximately 34 dB.

FIG. 11B shows the THD values of the virtual non-linear system model ("model") without and with applying the second variation of the method ("DSP"). The model without DSP predicts the THD values of the original simulated non-linear system (cf. FIG. 11A, graph "original without DSP") almost identically. This result is obtained after optimizing the second target function 85a. Reducing the non-linear distortions works better with the model, as can be expected, since the model deviates slightly from the original system, but the predistortion parameters were optimized using the model. The THD values with DSP are approximately between 0.04% and 0.4%. Basically, FIG. 11, in 11A and 11B, shows that applying the second variation of the method after finishing all the optimizations results in a considerable reduction of non-linear distortions of the, in this case simulated, real sink 50.

FIG. 12 shows a transfer function for the original and for the model. The transfer function is represented in dependence of the amplitude in dB relative to the frequency in Hz. It can be seen that the model and the original are almost one above the other. FIG. 12 shows that the virtual non-linear system model ("models") after optimizing the second target function 85a, predicts the transfer function—unknown from the point of view of the model—of the original simulated non-linear system ("original") extremely precisely (maximum deviation<0.5 dB). This shows, in combination with FIG. 11, that the non-linear system model 50a after optimizing the second target function 85a is able to map the linear and non-linear transfer properties of a, in this case simulated, real sink 50.

FIGS. 11 and 12 show that the second variation works both as regards system identification (adapting the virtual system model to the sink) and as regards predistortion (applying virtually optimized parameters to predistortion for the real sink).

It is to be pointed out here that, in the present disclosure, a predistorted signal 40, 40a is described. By feeding the sensor signal 70 of the sink 50 back to the controller 30 and continuously adapting the distortion parameters r in a loop, predistortion can be adapted continuously so that, in the best case, the second signal 70 no longer contains any distortion after expiry of a time interval in which optimization has been finished. At the same time, the operating point and/or the operating range of the circuit can be operated by the adjusting signal in a basically constant operating point and/or constant operating range.

Figure 13:
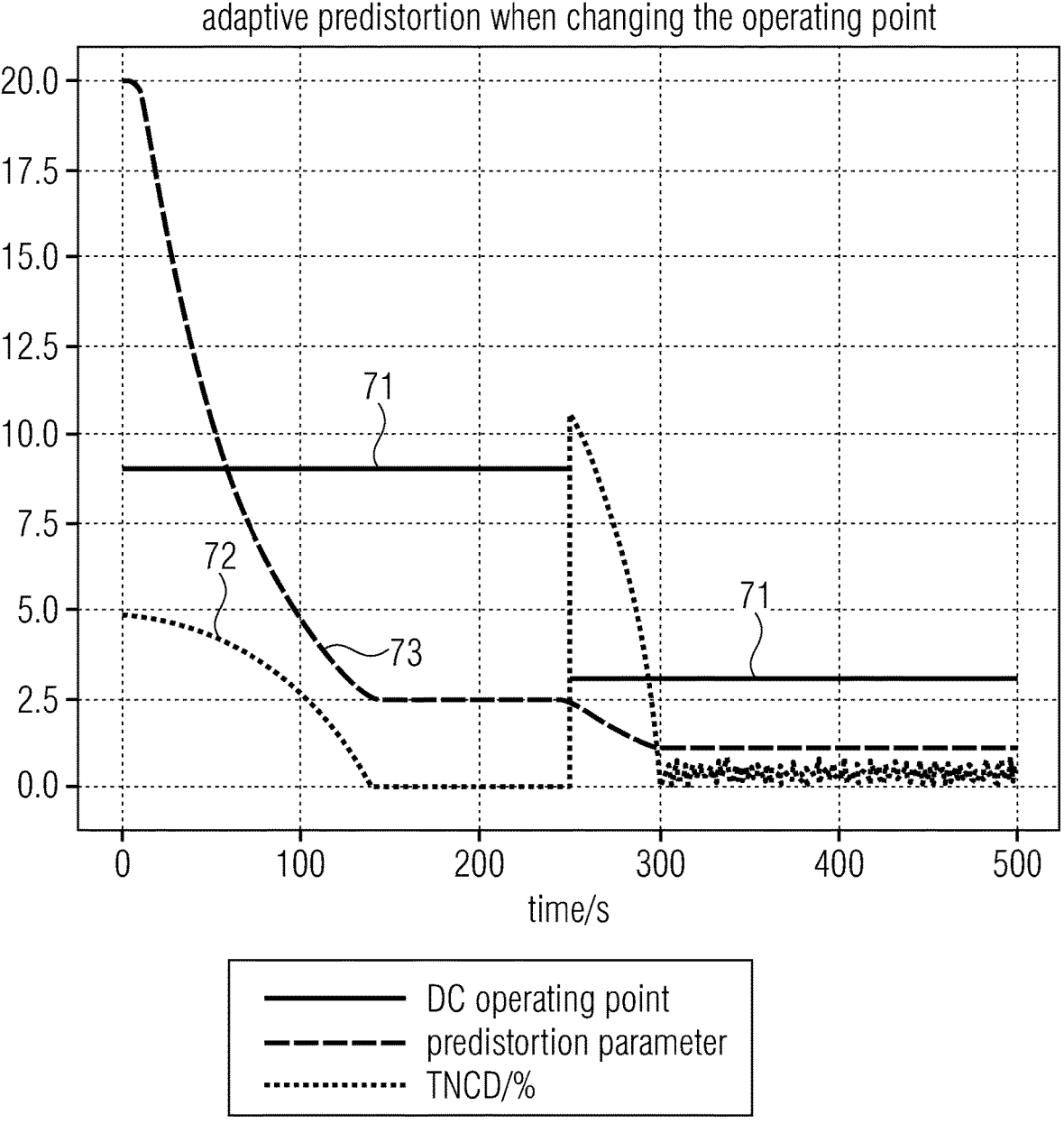
FIG. 13 shows simulation results of an adaptive distortion when changing the operating point.

FIG. 13 shows simulation results of an adaptive predistortion when changing the operating point. In FIG. 13, the DC operating point 71, the calculated values of the predistortion parameter 73 and the total non-coherent distortion (TNCD) 72 are illustrated. It can be seen that the predistortion parameter 73 adapts, starting from its initial value, to the DC operating point 71 between 0 s and 140 s and the total non-coherent distortion 72 decreases to the value 0 in the meantime. Between 140 s and 250 s, the operating point 71, the calculated predistortion parameters 73 and the total non-coherent distortion 72 are constant. In addition, FIG. 13 shows that, when shifting the DC operating point 71, at roughly 250 s, the total non-coherent distortion 72 increases sharply. As a consequence, the predistortion parameters 32 are set to the shifted DC operating point 71, which results in a reduction in the total non-coherent distortion 72 (TNCD), in particular at 250 s to 300 s. At roughly 300 s and after that, the DC operating point 71, the calculated predistortion parameters 72 and the total non-coherent distortion 72 are constant.

Another aspect of the present disclosure relates to a method for compensating non-linearities essentially without changing a characteristic curve operating point and/or characteristic curve operating range. FIG. 14 shows a flow chart of the suggested method 130. The method 130 comprises at least steps 131 to 136. In step 131, the method 130 comprises providing an input signal by an alternating voltage signal source.

In particular, the alternating voltage signals provided by the alternating voltage signal source in this case are to be understood to be discrete amplitude values at regular sampling times, which reach the controller. However, it is also conceivable for the controller to be provided with analog signals which may be transformed to digital signals by the controller. An analog implementation of the controller 30 is possible basically, wherein analog signals may also be used. However, advantageously, digital or digitalized signals are used. Here, an A/D conversion before the controller 30 and a D/A conversion after the controller 30 may be provided.

In step 132, the method 130 comprises receiving the input signal 20 by a controller 30 and converting the input signal 20 to a predistorted signal 40 by means of at least one preset predistortion parameter. The at least one preset predistortion parameter may be stored in a database which the controller 30 may access. Thus, the at least one preset predistortion parameter may be saved, in particular overwritten and/or stored in the database, if required, by a user or after finishing previous optimization. A discussion of the predistorted signal 40 was given already when describing the circuit. In order to avoid redundancies, this explanation will not be repeated.

In step 133, the method 130 comprises subsequently receiving the predistorted signal 40 by a sink 50, wherein the sink is coupled to an adjusting unit 60.

In step 134, the method 130 comprises, at the same time as receiving the predistorted signal by the sink, providing the sink with an adjusting signal by the adjusting unit in order to operate the sink in an operating range or at an operating point. By providing the sink 50 with the adjusting signal, the operating point and/or the operating range of the circuit 100 can be adjusted.

An operating point (DC offset) is predetermined by means of the adjusting signal 20. If the same is changed intentionally or unintentionally, the method disclosed here is able to track the change sufficiently quickly (as regards optimization of the predistortion parameters) when the change is only slight and/or takes place relatively slowly. This has been discussed before in detail with relation to the circuit 100, which is referred to here again.

In step 135, the method 130 comprises subsequently receiving at least one sensor signal output at the sink in a feedback manner by the controller for adapting the at least one preset predistortion parameter based on the at least one sensor signal.

The at least one predistortion parameter is adapted as frequently until the distortion of the sensor signal 70 has been compensated in the best way possible. Here, the input signal is predistorted with each parameter variation with the respective current parameters, in particular in accordance with the control loop described here. Compensation of the distortion takes place automatically.

In step 136, the method 130 comprises converting the input signal to a predistorted signal by means of the at least one adapted predistortion parameter in order to provide the sink with the predistorted signal, without essentially changing the characteristic curve operating point and/or characteristic curve operating range. The input signal 20 itself is not changed so as to maintain the characteristic curve operating point or range.

The method steps 131 to 136 may be executed one after the other in increasing order with their numbering, wherein, particularly advantageously, steps 133 and 134 can be executed in parallel. Steps 131 to 136 are all in parallel. Prima facie, this seems to be contradictive; however, it is not. The reason: In an analog implementation, it would take place continuously simultaneously. In the advantageous digital implementation, however, it is performed simultaneously at fixed switching points in time, like the sample rate. Some steps may, in particular in the digital implementation, take somewhat longer than others. It is, for example, conceivable for the input signal to be received at every sampling time and the predistorted signal to be output at every sampling time, but that optimization of the first target function is performed based on signal blocks made of P sample values and a parameter variation takes place only every P sampling times, P being a natural number. For example, a signal block may comprise P=256 sample values. A signal block may also comprise a different number of sample values. Nevertheless, the steps are performed in parallel.

Advantageously, the method 130 comprises providing the adjusting signal in the form of a direct voltage for the sink 50 by the adjusting unit 60, in particular such that the sink 50 has a fixedly predetermined operating point and/or operating range, or changing only slightly in relation to the application, by means of the adjusting signal which in particular is any selected direct voltage. A slight change in the operating point and/or operating range comprises a time window during which optimization of the target function has enough time to converge. This has been discussed in greater detail above in relation to the circuit 100, which is made reference to here again.

Advantageously, the method 130 comprises changing the at least one predistortion parameter r based on the at least one sensor signal 40 such that a first target function 80 is minimized, in particular that the first target function 80 is calculated based on the at least one sensor signal 40 or based on the at least one sensor signal 40 and based on the input signal 20. The first target function 80 may consequently exhibit a dependence on the sensor signal 40 or on the sensor signal 40 and the input signal 20. It is also conceivable to have a user decide on whether the adaptation of the at least one distortion parameter is to take place using both signals 20, 40.

Advantageously, the first target function 80 comprises a function or functions which determine a measured value or measured values of characterizing non-linearity of a system, wherein a measured value is, for example, a distortion factor or total harmonic distortion or total non-coherent distortion. As regards robustness of the optimization, it may be of advantage for a number of measured values to be considered in the first target function 80. If, for example, several sensor signals are available, these may be considered and weighted using a measured value. It may be of advantage to use and weight several different distortion measured values.

Advantageously, the method 130 comprises weighting the first target function 80 as regards non-linear distortions and a change in level at an output of the sink 50 if the first target function 80 comprises a measure of the change in level at the output of the sink 80. Basically, the output level without predistortion is to be compared to the output level while using predistortion and the latter is to be adapted to the first one. In other words, the difference between output level without predistortion and output level with predistortion is to be minimized or else the ratio to be brought close to 1. In accordance with a first option, a difference could be calculated and a ratio be formed in accordance with a second option. Additionally, it is conceivable to use levels (in dB, i.e. logarithmic) or the output amplitude (in Volt, for example, i.e. linear).

The respective output level (with/without predistortion) can be detected by switching on/off predistortion or by determining effective/effectless parameters. The output levels are to be comparable. This is, for example, the case if the input signal comprises temporally constant features, as is the case, for example, in quasi-stationary individual or multi-tone signals. In the second variation, more complex/dynamic signals could be used since the virtual input signal is completely controllable and, thus, repeatable.

Weighting the first target function $f_1$ can be expressed as an equation as follows:

$$f_1 = A^*(\text{measure of distortion}) + (1-A)^*(\text{change in level})$$

with the real number $0 <= A <= 1$. The measure of distortion and the change in level can be weighted in $f_1$. with the parameter A.

An example of a first and second target function is given, for example, by the following functions:
1. Target function $f_1$ $$f_1 = A^*\text{THD}(y) + (1-A)^*\Delta L$$

with A as above, THD(y) of the Total Harmonic Distortion in the sensor signal y with a certain frequency and the magnitude difference in level $\Delta L$ between y with and without predistortion.
2. Target function $f_2$ $$f_2 = (y - y_{virtual})^2$$

i.e. the squared deviation between the measured sensor signal 70 and the virtual signal 70a, which particularly is usually averaged over a time window.

Advantageously, the method 130 comprises minimizing the first target function 80 by means of a mathematical optimization method, which is selected in particular based on properties of the input signal 20, or minimizing the first target function by means of adequately adjusted extreme value regulators for any input signals 20. Selecting the optimization method has been described already in the context of the circuit, which is to be referred to here. Optimizing the first target function is to be performed temporally successively or in parallel for the predistortions of different orders.

The method 130 comprises performing N−1 predistortion iteration steps of different order n, with $1 < n <= N$, to minimize the first target function 80, N being a natural number greater than 1. Optimizing the predistortion parameters may take place in parallel for all predistortions. The predistortions have to be applied to the signal one after the other, in increasing order. A selection of orders may be done before an iteration. Certain distortion orders are identified, manually or automatically, to be particularly critical (for example $3^{rd}$ harmonic and 5th harmonic are particularly energetic, for example, they have more than 1% of the level of the basic frequency in a sinusoidal tone input signal), and these orders (like 3 and 5) are then introduced into the distortion cascade. All the other orders are not contained in the cascade.

The used orders of the predistortions are restricted to the smallest possible number of relevant ones, in particular for two reasons:
1. To save time/calculating complexity.
2. Additional, maybe unrequired predistortions of different orders may unintentionally result in more distortions at the output of the sink.

Advantageously, the method 130 thus comprises adapting the predistortion parameters of each one of the at most N−1 predistortion iteration steps to characteristics of the sink, either in increasing order n temporally successively or temporally in parallel by means of multi-dimensional optimization of the first target function.

Advantageously, the method 130, after performing the iteration, comprises outputting a predistorted signal 40 by the controller 30 to pass it on to the sink 50, in particular to pass the sensor signal 70 on to the controller 30. The sensor signal 70 is consequently fed back to the controller 30. Here, the distortion parameters or the at least one distortion parameter may be adapted if required.

Advantageously, the method 130 comprises, if the input signal 20 is not band-limited sufficiently, avoiding temporal aliasing by an increase in sample rate 34 of the input signal 20. As is illustrated in FIGS. 4 and 10, an increase in sample rate 34 takes place in the controller 30, in particular after having passed on the input signal 40 to the controller 30. It can be gathered from FIG. 4 that the input signal 20 before increasing the sample rate with the sensor signal 70 enters into the first target function 80. In order to calculate the first target function 80, the input signal 20 and the sensor signal 70 use identical sampling, which normally is the case. The sensor signal 70 consequently never has to be over-sampled (see FIG. 4). Alternatively or additionally to increasing the sample rate, the input signal 20 may also be band-limited at this point.

Advantageously, the method 130 comprises compensating non-linearities of the form $y=(a+bx)^n$, a and b being real coefficients and the output signal y and the input signal x being real numbers and $n \geq 2$ being a natural number which describes the order of non-linearity. The range of values $-1 \leq x \leq 1$ indicates the operating range of the input signal 40, which has been normalized. It is important that the operating range of the input signal 40, i.e. the maximum and minimum allowed values, are known in order to maintain the operating range with the future normalization of the predistorted signal 40.

In the embodiments, the predistortion functions are such that they particularly compensate distortions of a single order and not several orders at the same time. In other words: An nth-order predistortion contains an nth-order predistortion function and primarily compensates non-linear nth-order distortions. The equation $y=(a+bx)^n$ consequently describes a type of non-linearity which can be compensated particularly well by a single nth-order predistortion. Basically, any, i.e. also any complex, predistortion function can be selected to at least partly compensate non-linearities of different orders, which may, for example, be given by a polynomial $y=a0+a1^*x+a2^*x^2+\ldots$ An nth-order predistortion contains an nth-order predistortion function and primarily compensates non-linear nth-order distortions. An example of non-linearity is given by $y=(a+bx)^n$, which has already been described before.

The further advantageous embodiment in accordance with FIG. 3 describes, for example, cascading or iteration of predistortions of different orders. By being placed one after the other, not only can distortions of a single order be compensated, but specifically different orders at the same time. Thus, also non-linear distortions of more complex systems, like $y=a0+a1^*x+a2^*x^2+\ldots$ or $y=(a1+b1^*x)^2+(a2+b2^*x)^3$ can be compensated.

Since the predistorted signal 40 in the first variation is passed on continuously to the sink 50, compensation of non-linearities will always take place, no matter if the first target function 80 is being minimized or not. The consequence of this is that generally the non-linear distortions are minimized and no non-linearities of any special form are compensated.

If an increase in sample rate 34 takes place before the predistortion iteration step 35 of n-th-order, after the n-th-order predistortion iteration step 35, a reduction in sample rate 36 takes place, in particular to bring the input signal 20 back to the original sample rate. The increase in sample rate 34 and the reduction in sample rate 36 are executed both one after the other if the sample rate is changed. The increase in sample rate 34 and the reduction in sample rate 36 are optional.

Advantageously, the method 130 comprises detecting a DC offset in the signal, in particular in the predistorted signal 40, 40a, which is caused by the n-th-order predistortion iteration step 35 (predistortion functions 35, 35a). After detecting the DC offset, subsequently changing or removing the DC offset takes place. Removing the DC offset may particularly be performed by means of a high-pass filter with a sufficiently deep cut-off frequency and/or by means of mean value calculation using a predistortion parameter r, and subsequent subtraction. Changing the DC offset may take place by adapting the DC offset. When removing the DC offset, the operating point is maintained. When adapting, the operating range is maintained. The term "sufficiently"

here means maintaining the bandwidth of the input signal 20. As regards an order, the person skilled in the art means that at first mean value calculation takes place, then subtraction and subsequently using the high-pass filter. In FIG. 4, for example, the mean value calculation is described using a predistortion parameter r and subsequent subtraction, for example by mean value suppression 37. In FIG. 4, the mean value suppression is shown as an example of mean value adaptation 37. The DC offset, i.e. the direct voltage portion, is an undesired by-product of the non-linear predistortion in case the operating point is to be maintained. The DC offset is undesired since it would change the operating point. Thus, as is described, it is in particular suggested herein to remove again, in particular compensate the DC offset.

Advantageously, the method 130 comprises normalising 38 the predistorted signal 40 to keep the predistorted signal 40 at the output of the controller 30 in the original operating range of the input signal. Due to the DC offset compensation, the operating point and/or the operating range may basically be kept constant. If the operating range of the input signal 20 is known, the operating range can be maintained by means of the normalization.

In accordance with a second variation of the method 130, at first minimizing a second target function 85a takes place by adapting the predistortion parameter(s) of a non-linear system model 50a such that a deviation between a sensor signal 70 at an output of the sink 50 and a virtual sensor signal 70a or between a quantity derived from the sensor signal 70 and a quantity derived from the virtual sensor signal 70a is minimized. Minimizing the second target function 85a takes place virtually so that operation of the circuit 100, as has been described already for the first variation, can be continued independently. The second variation of the method is shown in FIGS. 9 and 10. Virtually in this case means that at least once, but in particular also more frequently, the real sensor signal 70 is tapped and the virtual sensor signal 70a which corresponds to an output signal of the non-linear system model 50a is matched to the real sensor signal 70 as closely as possible by means of optimizing the model parameters. Minimizing the second target function 85a takes place "on the side". In particular, the operation of the sink 50 with the input signal 20 or the predistorted signal 40 is not disturbed by this.

After performing minimizing the second target function 85a, minimization of a first target function 80, 80a is performed, as has been described already in the context of the first variation of the method before, to minimize non-linear distortions at the output of the non-linear system model. The second variation of the method is consequently at first executed virtually. Virtual execution comprises minimizing the second target function 85a and may comprise minimizing the first target function 80, 80a. The first target function 80, 80a can be optimized, in particular minimized virtually (second variation) or in real (first variation). In the "adaptive feed forward" paradigm in accordance with the second variation, the first target function 80a is optimized virtually, in particular always. It can be seen, for example, in FIGS. 9 and 10 in that, in FIGS. 9 and 10, the real sensor signal 50 is used only in the optimization of the second target function 85a and not in the optimization of the first target function 80a. In accordance with the second variation, advantageously, all the target functions are optimized virtually. A hybrid system (mixture of first and second variation) which uses a virtual system model on the one hand, but may also use the real sensor system 50 for optimizing the first target function 80a is also conceivable.

Additionally, after performing minimization of the second target function 85a and the first target function 80, 80a, outputting a predistorted signal 40, 40a and passing on the predistorted signal 40, 40a to the sink 50, 50a take place. This may be done virtually or in real. However, it is also conceivable for this procedure to be performed at first virtually and subsequently in real.

The second variation can be summarized to form three steps as follows:

1. Initial state: the real and virtual predistortions are adjusted such that they do not have a noticeable influence on sensor signal 70, 70a, the non-linear system model 50a still is in the initial state.
2. Virtual optimization of the second and, subsequently, of the first target function 85a, 80a.
3. The real predistortion is, after optimization, equipped with the same parameters as the virtual predistortion.

Advantageously, adapting the at least one parameter of the system model and/or of the at least one distortion parameter is performed once, continuously, in certain time intervals or when exceeding threshold values of the first target function or the second target function. Adapting relates both to the first variation, which particularly describes a closed-loop (feedback) variation, and the second variation which particularly describes an open-loop (feedforward) variation, of the method 130. The "virtual" processing in the second variation may only take place since there is no closed loop with predistortion and the real sink 50.

Advantageously, in a method in accordance with the first variation or the second variation, dividing the input signal 20, 20a, applied in particular to the circuit 100 in real and/or virtually, into frequency bands by means of a filter bank before converting the input signal (20, 20a) to a number of frequency-band-dependent input signals (20, 20a) takes place, subsequently, in particular in real and/or virtually, predistorting 35, 35a the frequency-band-dependent input signals 20, 20a; and merging the number of frequency-band-dependent distorted signals 40, 40a to form a total predistorted signal 40, 40a, before the one total predistorted signal 40, 40a at the output of the controller 30, 30a is passed on to the sink 50 or non-linear system model 50a. The frequency bands may have to be predistorted differently and in this case consequently use different predistortions. Predistorting takes place particularly optimized to the respective frequency band. Not all the frequency bands are to be distorted equally, except the non-linearities of all the frequency bands exhibit an identical behavior.

A further aspect of the present invention relates to a computer-readable storage medium, comprising instructions which, when executed by a computer which is coupled to a circuit 100, cause the same to execute the first or second method, as described here, with the circuit 100.

It is to be pointed out that, in particular in an analog implementation of the circuit, no digital signal processor is involved. Rather, analog passive and active electronic devices are used, in particular resistors R, inductances L, capacities C, operational amplifiers, diodes, transistors, potentiometers etc. The processed signal would be analog, not digital. Analog implementations of the circuit are conceivable.

Even though some aspects have been described within the context of a device, it is understood that these aspects also represent a description of the corresponding method so that a block or a structural component of a device/circuit is also to be understood as a corresponding method step or as a feature of a method step. Illustrating the present invention in the form of method steps is refrained from for reasons of redundancy. Some or all of the method steps may be performed by a hardware apparatus (or using a hardware apparatus), such as a microprocessor, a programmable computer or an electronic circuit. In some embodiments, some or several of the most important method steps may be performed by such an apparatus.

In the above detailed description, different features were partly grouped together in examples so as to streamline the disclosure. This type of disclosure is not to be interpreted as intending the claimed examples to comprise more features than are explicitly indicated in each claim. Rather, as is expressed by the following claims, the subject-matter may be less than all the features of an individual disclosed example. Consequently, the following claims are incorporated herewith into the detailed description, wherein each claim may stand as its own separate example. Whereas each claim may stand as an individual separate example, it is to be mention that, although dependent claims in the claims refer back to a specific combination with one or more other claims, other examples also comprise a combination of dependent claims with the subject-matter of each other dependent claim, or a combination of each feature with other dependent or independent claims. Such combinations are to be included, unless it is expressed explicitly that a specific combination is not intended. Additionally a combination of features of one claim with every other independent claim is also used even if this claim is not dependent directly on the independent claim.

Depending on specific implementation requirements, embodiments of the invention may be implemented in hardware or in software or at least partly in hardware or at least partly in software. Implementation may be effected while using a digital storage medium, for example a floppy disc, DVD, Blu-ray disc, CD, ROM, PROM, EPROM, EEPROM or FLASH memory, a hard disc or any other magnetic or optical memory which has electronically readable control signals stored thereon which may cooperate, or cooperate, with a programmable computer system such that the respective method is performed. This is why the digital storage medium which can execute the suggested teaching may be computer-readable.

Some embodiments in accordance with the invention described herein thus comprise a data carrier which comprises electronically readable control signals that are capable of cooperating with a programmable computer system such that any of the methods described herein is performed.

Generally, embodiments of the teaching described herein may be implemented as a computer program product having a program code, the program code being effective to perform any of the methods when the computer program product runs on a computer.

The program code may also be stored on a machine-readable carrier, for example.

Other embodiments include the computer program for performing any of the features described therein as methods, the computer program being stored on a machine-readable carrier. In other words, an embodiment of the inventive method thus is a computer program which has program code for performing any of the methods described herein, when the computer program runs on a computer.

A further embodiment of the suggested methods thus is a data carrier (or a digital storage medium or a computer-readable medium) on which the computer program for performing any of the methods described herein is recorded. The data carrier or the digital storage medium or the computer-readable medium are typically tangible, or non-volatile.

A further embodiment of the inventive method thus is a data stream or a sequence of signals representing the computer program for performing any of the methods described herein. The data stream or the sequence of signals may be configured, for example, to be transferred via a data communication link, for example via the Internet.

A further embodiment includes processing means, for example a computer or a programmable logic device, configured or adapted to perform any of the methods to the system described herein.

A further embodiment includes a computer on which the computer program for performing any of the methods described herein is installed.

A further embodiment in accordance with the invention includes a device or a system configured to transmit a computer program for performing at least one of the methods described herein in the form of a method to a receiver. The transmission may be electronic or optical, for example. The receiver may be a computer, a mobile device, a memory device or a similar device, for example. The device or the system may include a file server for transmitting the computer program to the receiver, for example.

In some embodiments, a programmable logic device (for example a field-programmable gate array, FPGA, for example) may be used for performing some or all of the functionalities of the methods and devices described herein. In some embodiments, a field-programmable gate array may cooperate with a microprocessor to perform the method described herein. Generally, the method is performed, in some embodiments, by any hardware device, which may be any universally applicable hardware such as a computer processor (CPU), or may be hardware specific to the method, such as an ASIC.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. A circuit for compensating non-linearities essentially without changing a characteristic curve operating point and/or characteristic curve operating range, the circuit comprising:

an alternating voltage signal source for providing an input signal;

a control unit which receives the input signal and converts the input signal to a predistorted signal depending on at least one preset predistortion parameter; and a sink for receiving the predistorted signal, the sink being coupled to an adjusting unit configured to provide the sink with an adjusting signal, to operate the sink in an operating range or at an operating point, wherein the control unit is configured to receive at least one sensor signal of the sink in a feedback manner and to adapt the at least one preset predistortion parameter based on the at least one sensor signal, wherein the control unit converts the input signal to a predistorted signal by means of the at least one adapted predistortion parameter to provide the sink with the predistorted signal, without essentially changing the characteristic curve operating point and/or characteristic point operating range.

2. The circuit in accordance with claim 1, wherein, if the predistorted signal comprises a DC portion, the control unit is configured to adapt or remove the DC portion, in particular, when removing, calculate the DC portion using the predistortion parameters and subsequently subtract the calculated DC portion from the predistorted signal and/or remove the same from the predistorted signal by means of a high-pass filter or sufficiently deep cut-off frequency.

3. The circuit in accordance with claim 1, wherein the control unit is configured to normalize the predistorted signal to maintain the predistorted signal at the output of the controller in the original operating range of the input signal.

4. The circuit in accordance with claim 1, wherein the at least one sensor signal of the sink comprises a measured output voltage and/or an output current intensity and/or a sound pressure and/or a surface vibration and/or the like.

5. The circuit in accordance with claim 1, wherein the adjusting unit is a direct voltage source and provides the input signal as a direct voltage for the sink.

6. The circuit in accordance with claim 1, wherein the sink, by means of the adjusting signal which particularly is any selected direct voltage, comprises a predetermined operating point or operating range, or one changing only slightly depending on the application.

7. The circuit in accordance with claim 1, wherein the control unit is configured to change the at least one predistortion parameter based on the at least one sensor signal such that a first target function is minimized, in particular such that the first target function is calculated based on the at least one sensor signal or based on the at least one sensor signal and based on the input signal.

8. The circuit in accordance with claim 7, wherein the first target function comprises a function or functions which determine a measured value or measured values for characterizing non-linearity of a system, wherein a measured value is, for example, a distortion factor or total harmonic distortion or total non-coherent distortion.

9. The circuit in accordance with claim 7, wherein the control unit is configured to weight the first target function as regards non-linear distortions and a change in level at an output of the sink if the first target function comprises a measure of the change in level at the output of the sink.

10. The circuit in accordance with claim 7, wherein the control unit is configured to minimize the first target function based on an iteration of at most N−1 predistortion iteration steps of different orders $1<n<=N$, N being a natural number greater than 1.

11. The circuit in accordance with claim 10, wherein the control unit is configured to output, after performing the iteration, a predistorted signal to pass it on to the sink which particularly passes on the sensor signal to the measured value.

12. The circuit in accordance with claim 10, wherein the control unit is configured to adapt the predistortion parameters of each of the, in particular at most N−1, predistortion iteration steps to characteristics of the sink either in increasing order temporally successively by means of one-dimensional optimization, or temporally in parallel by means of multi-dimensional optimization of the first target function.

13. The circuit in accordance with claim 7, wherein the control unit is configured to minimize the first target function by means of a mathematical optimization method, in particular additionally configured to select the mathematical optimization method based on properties of the input signal, or to minimize the first target function by means of adequately adjusted extreme value regulators for any input signals.

14. The circuit in accordance with claim 1, wherein the control unit is configured to minimize a second target function by adapting at least one model parameter of a non-linear system model such that a deviation between the sensor signal or a quantity derived from the sensor signal at an output of the sink and a virtual sensor signal or a quantity derived from the virtual sensor signal is minimized.

15. The circuit in accordance with claim 14, wherein the control unit is configured to perform, after performing minimization of the second target function, minimization of a first target unction to minimize non-linear distortions at the output of the non-linear system model.

16. The circuit in accordance with claim 14, wherein the control unit is configured to output, after performing minimization of the second target function and the first target function, a predistorted signal to pass it on to the sink.

17. A method for compensating non-linearities essentially without changing a characteristic curve operating point and/or characteristic curve operating range, the method comprising:

providing an input signal by an alternating voltage signal source;

receiving the input signal by a control unit and converting the input signal to a predistorted signal by means of at least one preset predistortion parameter;

subsequently receiving the predistorted signal by a sink, the sink being coupled to an adjusting unit;

simultaneously to receiving the predistorted signal by the sink, providing the sink with an adjusting signal by the adjusting unit to operate the sink in an operating range and/or at an operating point;

subsequently receiving at least one sensor signal output at the sink in a feedback manner by the control unit for adapting the at least one preset predistortion parameter based on the at least one sensor signal;

converting the input signal to a predistorted signal by means of the at least one adapted predistortion parameter to provide the sink with the predistorted signal, without essentially changing the characteristic curve operating point and/or characteristic curve operating range.

18. The method in accordance with claim 17, comprising:

providing the adjusting signal in the form of a direct voltage for the sink by the adjusting unit, in particular such that the sink, by means of the adjusting signal which particularly is any selected direct voltage, comprises a fixed predetermined operating point or operating range, or one changing only slightly depending on the application.

19. The method in accordance with claim 17, comprising:

changing the at least one predistortion parameter based on the at least one sensor signal such that a first target function is minimized, in particular such that the first target function is calculated based on the at least one sensor signal or based on the at least one sensor signal and based on the input signal.

20. The method in accordance with claim 19, wherein the first target function comprises a function or functions which determine a measured value or measured values for characterizing non-linearity of a system, wherein a measured value is, for example, a distortion factor or total harmonic distortion or total non-coherent distortion.

21. The method in accordance with claim 19, comprising:

weighting the first target function as regards non-linear distortions and a change in level at an output of the sink if the first target function comprises a measure of the change in level at the output of the sink.

22. The method in accordance with claim 19, comprising:

minimizing the first target function by means of a mathematical optimization method, which is select in particular based on properties of the input signal, or minimizing the first target function by means of adequately adjusted extreme value regulators for any input signals.

23. The method in accordance with claim 19, comprising:

performing at most N−1 predistortion iteration steps of different order 1<n<=N, to minimize the first target function, N being a natural number greater than 1.

24. The method in accordance with claim 23, comprising:

after performing the iteration, outputting a predistorted signal by the control unit to pass it on to the sink, in particular to pass the sensor signal on to the control unit.

25. The method in accordance with claim 23, the method comprising:

adapting the predistortion parameters of each of the at most N−1 predistortion iteration steps to characteristics of the sink either in increasing order temporally successively, or temporally in parallel by means of multi-dimensional optimization of the first target function.

26. The method in accordance with claim 23, comprising:

if the input signal is not band-limited sufficiently, avoiding temporal aliasing by an increase in sample rate of the input signal.

27. The method in accordance with claim 23, comprising:

compensating non-linearities of the form $y=(a+bx)^n$, a and b being real coefficients and the output signal y and the input signal x being real numbers, and $n \geq 2$ being a natural number which describes the order of non-linearity.

28. The method in accordance with claim 23, comprising:

if an increase in sample rate takes place before the predistortion iteration step of n-th order, after the predistortion iteration step of n-th order, performing a reduction in sample rate, in particular to bring the input signal to the original sample rate.

29. The method in accordance with claim 17, comprising:

detecting a DC portion in the predistorted signal caused by the predistortion iteration step of n-th order (predistortion function), subsequently changing or removing the DC portion by means of a high-pass filter of sufficiently deep cut-off frequency, and/or by means of mean value calculation using a predistortion parameter r, and subsequent subtraction.

30. The method in accordance with claim 17, comprising:

normalizing the predistorted signal to maintain the predistorted signal at the output of the control unit in the original operating range of the input signal.

31. The method in accordance with claim 17, comprising:

at first minimizing a second target function by adapting the predistortion parameter(s) of a non-linear system model such that a deviation between the sensor signal at an output of the sink and a virtual sensor signal or between a quantity derived from the sensor signal and a quantity derived from the virtual sensor signal is minimized.

32. The method in accordance with claim 31, comprising:

after performing minimizing the second target function, performing minimization of a first target function to minimize non-linear distortions at the output of the non-linear system model.

33. The method in accordance with claim 31, comprising:

after performing minimizing the second target function and the first target function, outputting a predistorted signal and passing the predistorted signal on to the sink.

34. The method in accordance with claim 17, comprising:
adapting the at least one parameter of the system model and/or the at least one distortion parameter once, continuously, in certain time intervals or when exceeding threshold values of the first target function or the second target function.

35. The method in accordance with claim 17, comprising:
dividing the input signal into frequency bands by means of a filter bank before converting the input signal to a number of frequency-band-dependent input signals,
predistorting the frequency-band-dependent input signals; and
merging the number of frequency-band-dependent distorted signals to form a total predistorted signal before the one total predistorted signal at the output of the control unit is passed on to the sink.

36. A non-transitory digital storage medium having stored thereon a computer program for performing a method for compensating non-linearities essentially without changing a characteristic curve operating point and/or characteristic curve operating range, the method comprising:

providing an input signal by an alternating voltage signal source;
receiving the input signal by a control unit and
converting the input signal to a predistorted signal by means of at least one preset predistortion parameter;
subsequently receiving the predistorted signal by a sink, the sink being coupled to an adjusting unit;
simultaneously to receiving the predistorted signal by the sink, providing the sink with an adjusting signal by the adjusting unit to operate the sink in an operating range and/or at an operating point;
subsequently receiving at least one sensor signal output at the sink in a feedback manner by the control unit for
adapting the at least one preset predistortion parameter based on the at least one sensor signal;
converting the input signal to a predistorted signal by means of the at least one adapted predistortion parameter to provide the sink with the predistorted signal, without essentially changing the characteristic curve operating point and/or characteristic curve operating range,
when the computer program is run by a computer coupled to a circuit.

\* \* \* \* \*